US008105857B2

(12) United States Patent
Takagi et al.

(10) Patent No.: US 8,105,857 B2
(45) Date of Patent: Jan. 31, 2012

(54) METHOD OF FABRICATING GROUP-III NITRIDE SEMICONDUCTOR LASER DEVICE

(75) Inventors: Shimpei Takagi, Osaka (JP); Yusuke Yoshizumi, Itami (JP); Koji Katayama, Osaka (JP); Masaki Ueno, Itami (JP); Takatoshi Ikegami, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 32 days.

(21) Appl. No.: 12/837,306

(22) Filed: Jul. 15, 2010

(65) Prior Publication Data

US 2011/0300653 A1 Dec. 8, 2011

(30) Foreign Application Priority Data

Jun. 8, 2010 (JP) ................. 2010-131406

(51) Int. Cl.
 *H01L 21/18* (2006.01)
(52) U.S. Cl. ............... 438/33; 438/22; 438/25; 438/29; 438/E21.085
(58) Field of Classification Search .............. 257/12–13, 257/94–98, 102; 438/22, 33, 25–27, 29, 438/46; 372/44.011, 45.01
See application file for complete search history.

(56) References Cited

U.S. PATENT DOCUMENTS

2009/0039361 A1* 2/2009 Li et al. ................. 257/94

FOREIGN PATENT DOCUMENTS

| JP | 2000-124537 | 4/2000 |
|---|---|---|
| JP | 2010-114418 | 5/2010 |

OTHER PUBLICATIONS

Nakamura et al., "InGaN-Based Multi-Quantum-Well-Structure Laser Diodes," Japanese Journal of Applied Physics, vol. 35, pp. L74-L76, (1996).
Asamizu et al., "Demonstration of 426nm InGaN/GaN Laser Diodes Fabricated on Free-Standing Semipolar (11-22) Gallium Nitride Substrates," Applied Physics Express 1, 091102-1-091102-3 (2008).
Yamaguchi, "Anisotropic Optical Matrix Elements in Strained GaN Quantum Wells on Semipolar and Nonpolar Substrates," Japanese Journal of Applied Physics, vol. 46, No. 33, L789-L791 (2007).

* cited by examiner

*Primary Examiner* — Dung A. Le
(74) *Attorney, Agent, or Firm* — Venable LLP; Michael A. Sartori

(57) ABSTRACT

A method for fabricating a III-nitride semiconductor laser device includes: forming a substrate product having a laser structure; scribing a first surface of the substrate product to form a scribed mark, which extends along a reference line indicative of a direction of the a-axis of the hexagonal III-nitride semiconductor, on the first surface, a scribed mark; mounting the substrate product on a breaking device to support first and second regions of the substrate product by first and second support portions, respectively, of the breaking device; and carrying out breakup of the substrate product by press in alignment with the scribed mark in a third region, without supporting the third region of the substrate product located between the first and second regions, to form another substrate product and a laser bar. First and second end faces of the laser bar form a laser cavity of the III-nitride semiconductor laser device.

19 Claims, 19 Drawing Sheets

(a)

(b)

(a)

(b)

(a)

(b)

(c)

(a)

(b)

(a)

(b)

METHOD OF FABRICATING GROUP-III NITRIDE SEMICONDUCTOR LASER DEVICE

BACKGROUND OF THE INVENTION

1. Field of the Invention

The present invention relates to a method for fabricating a Group III-nitride semiconductor laser device.

2. Related Background Art

Non-patent Literature 1 discloses a semiconductor laser made on a c-plane sapphire substrate. The mirror faces of the semiconductor laser are made by dry etching. It shows micrographs of the cavity mirror faces of the laser and describes that the roughness of the end faces is about 50 nm.

Non-patent Literature 2 discloses a semiconductor laser made on a (11-22)-plane GaN substrate. The mirror faces of the semiconductor laser are formed by dry etching.

Non-patent Literature 3 discloses a gallium nitride (GaN)-based semiconductor laser. It proposes generation of laser light polarized in an off direction of the c-axis of the substrate, in order to use m-planes of cleaved facets for the laser cavity. Specifically, this Literature discloses increase of the well thickness on a nonpolar surface and decrease of the well thickness on a semipolar surface.

Non-patent Literature 1: Jpn. J. Appl. Phys. Vol. 35, (1996) L74-L76

Non-patent Literature 2: Appl. Phys. Express 1 (2008) 091102

Non-patent Literature 3: Jpn. J. Appl. Phys. Vol. 46, (2007) L789

SUMMARY OF THE INVENTION

In the band structure of a GaN-based semiconductor, there are a number of transitions capable of lasing. According to Inventors' knowledge, it is considered that in the III-nitride semiconductor laser device using the semipolar-plane support base the c-axis of which is inclined toward the m-axis, the threshold current can be lowered when the laser waveguide extends along a plane defined by the c-axis and the m-axis. When the laser waveguide extends in this orientation, a lasing mode with the smallest transition energy (difference between conduction band energy and valence band energy) among the possible transitions becomes capable of lasing, and this mode becoming capable of lasing can reduce the threshold current.

However, this orientation of the laser waveguide does not allow use of the conventional cleaved facets such as c-planes, a-planes, or m-planes for the cavity mirrors. For this reason, the cavity mirrors have been made heretofore by forming dry-etched facets of semiconductor layers by reactive ion etching (RIE). There are now desires for improvement in the cavity mirrors formed by RIE, in terms of perpendicularity to the laser waveguide, flatness of the dry-etched facets, or ion damage. It becomes a heavy burden to derive process conditions for obtaining excellent dry-etched facets in the current technical level.

As far as the inventors know, no one has succeeded heretofore in achieving the III-nitride semiconductor laser device, which is formed on the semipolar plane, that has both of the laser waveguide extending in the inclination direction (off-axis direction) of the c-axis and the end faces for cavity mirrors formed without use of dry etching.

The inventors filed a Japanese patent application (Japanese Patent Application No. 2009-144442) associated with the present invention.

The present invention has been accomplished in view of the above-described circumstances. It is an object of the present invention to provide a method for fabricating a III-nitride semiconductor laser device, and the method can provide improvement in flatness of cavity mirrors in the III-nitride semiconductor laser device with a laser cavity enabling reduction in threshold current on a semipolar plane of a substrate inclined in a direction from the c-axis of a hexagonal III-nitride toward the m-axis thereof and can reduce the threshold current.

One aspect of the present invention relates to a method for fabricating a III-nitride semiconductor laser device. This method comprises the steps of: (a) forming a substrate product having a laser structure, the laser structure including a substrate and a semiconductor region, the substrate comprising a hexagonal III-nitride semiconductor and having a semipolar primary surface, and the semiconductor region being formed on the semipolar primary surface; (b) scribing a first surface of the substrate product to form the scribed mark on the first surface, the scribed mark extending along a reference line indicative of a direction of an a-axis of the hexagonal III-nitride semiconductor; (c) mounting the substrate product on a breaking device such that first and second support portions of the breaking device support first and second regions of the substrate product, respectively, after forming the scribed mark; and (d) carrying out breakup of the substrate product by press in alignment with the scribed mark in a third region of the substrate product, without supporting the third region, to form another substrate product and a laser bar, the third region being located between the first and second regions. The third region of the substrate product is adjacent to the first and second regions; the press is implemented against a second surface of the substrate product; a first edge of the first support portion is separated from a second edge of the second support portion; the substrate product is mounted on the support device so that the reference line is separated from a center line defining a center between the first edge and the second edge; the first surface is a surface opposite to the second surface; the semiconductor region is located between the first surface and the substrate; the laser bar has first and second end faces extending from the first surface to the second surface and being made by the breakup; the first and second end faces form a laser cavity of the III-nitride semiconductor laser device; the substrate product comprises an anode electrode and a cathode electrode provided on the laser structure; the semiconductor region includes a first cladding layer comprising a first conductivity type GaN-based semiconductor, a second cladding layer comprising a second conductivity type GaN-based semiconductor, and an active layer provided between the first cladding layer and the second cladding layer; the first cladding layer, the second cladding layer, and the active layer are arranged along a normal axis normal to the semipolar primary surface; a c-axis of the hexagonal III-nitride semiconductor of the substrate is inclined at an angle ALPHA with respect to an axis normal to the semipolar primary surface toward the m-axis of the hexagonal III-nitride semiconductor; and the first and second end faces intersect with an m-n plane defined by an m-axis of the hexagonal III-nitride semiconductor and the normal axis normal to the semipolar primary surface.

In this method, the substrate product is divided into the first and second regions of the substrate product to be supported during the breakup, and the third region of the substrate product to be pressed without being supported during the breakup. The substrate product is mounted on the breaking device so that the reference line is separated from the center line that defines the center between the first edge and the second edge. When the press is carried out in a manner such that shear force by press is applied at a position apart from the center line, different forces act in two portions, located on both sides of the reference line extending along the press line, of the third region. During a period of the press, bending moment and shear force act on the first portion that is between the supported first region and the pressed portion on the third region of the substrate product, and bending moment and shear force act on the second portion between the supported second region and the pressed portion on the third region of the substrate product. When the breakup is implemented by application of shear force at the boundary between the first portion and the second portion, a distribution of bending moment in the first portion is different from that in the second portion. This method improves the flatness of the cavity mirrors in the III-nitride semiconductor laser device.

In the fabricating method according to the foregoing aspect of the present invention, the angle ALPHA can be in the range of not less than 45 degrees and not more than 80 degrees or in the range of not less than 100 degrees and not more than 135 degrees. In this fabricating method, when the angle is in the range of less than 45 degrees or in the range of more than 135 degrees, the end faces formed by press are highly likely to be composed of m-planes. When the angle falls within the range of more than 80 degrees and less than 100 degrees, desired flatness and perpendicularity are not achieved.

In the fabricating method according to the foregoing aspect of the present invention, when the substrate product is mounted on the breaking device, a distance between the reference line and the center line is preferably not less than 100 µm. This method reduces difference in yield among substrate products.

In the fabricating method according to the foregoing aspect of the present invention, the distance, LENGTH, between the reference line and the center line can be not less than 200 µm on the first surface. In this method, when the distance LENGTH is not less than 200 µm, the yield improves among substrate products. In the fabricating method according to the foregoing aspect of the present invention, the distance LENGTH between the reference line and the center line can be in the range of not more than 400 µm.

In the fabricating method according to the foregoing aspect of the present invention, a distance between the first edge and the second edge can be not less than 1000 µm. In this method, if the distance between the first edge and the second edge is small, the bending moment on the substrate product is small during the press. For this reason, when the breakup is implemented by applying the shear force at the boundary between the first portion and the second portion of the third region of the substrate product, the difference is also small between the bending moment distribution in the first portion and the bending moment distribution in the second portion.

In the fabricating method according to the foregoing aspect of the present invention, the distance between the first edge and the second edge can be not more than 1500 µm. In this method, when the distance between the first edge and the second edge is more than 1500 µm, the distance between the first edge and the second edge, i.e., the width of the third region of the substrate product is larger than the cavity length and is several times the cavity length and, therefore, fracture will fail to occur at a position of a desired scribed mark but can occur at a position of another scribed mark.

In the fabricating method according to the foregoing aspect of the present invention, preferably, the scribed mark extends in a direction from the first surface to the second surface, along an a-n plane defined by the normal axis to the semipolar primary surface and the direction of the a-axis. In this fabricating method, the scribed mark extending in the direction from the first surface to the second surface along the a-n plane guides generation of the end face.

In the fabricating method according to the foregoing aspect of the present invention, preferably, the step of forming the substrate product comprises subjecting the substrate to such processing that a thickness of the substrate becomes not less than 50 µm; the processing is slicing or grinding; the second surface is a processed surface made by the processing, or a surface including an electrode formed on the processed surface. In this fabricating method, when the substrate thickness is not less than 50 µm, handling becomes easier and production yield becomes higher. With the substrate having such thickness, the first and second end faces can be formed in good yield with flatness and perpendicularity enough to construct the laser cavity of the III-nitride semiconductor laser device, or without ion damage.

In the fabricating method according to the foregoing aspect of the present invention, preferably, the step of forming the substrate product comprises subjecting the substrate to such processing that the thickness of the substrate becomes not more than 160 µm. In this fabricating method, when the substrate thickness is not more than 160 µm, the substrate is more suitable for obtaining excellent-quality fractured faces for the laser cavity.

In the fabricating method according to the foregoing aspect of the present invention, preferably, the scribing is carried out using a laser scriber; the scribed mark comprises a scribed groove; the scribed groove extends in the direction from the first surface toward the second surface, along the a-n plane defined by the direction of the a-axis and the normal axis to the semipolar primary surface. In this fabricating method, the scribed groove extends in the direction from the first surface toward the substrate. The other substrate product and the laser bar are formed by fracture of the substrate product, and propagation of the fracture is guided by the scribed groove extending in the foregoing depth direction.

In the fabricating method according to the foregoing aspect of the present invention, the semipolar primary surface can be any one of a {20-21} plane, a {10-11} plane, a {20-2-1} plane, and a {10-1-1} plane. By this fabricating method, the first and second end faces can be provided with flatness and perpendicularity enough to construct the laser cavity of the III-nitride semiconductor laser device, on any one of these typical semipolar planes.

In the fabricating method according to the foregoing aspect of the present invention, the semipolar primary surface also suitably applicable is a surface with a slant in the range of not less than −4 degrees and not more than +4 degrees from any one semipolar plane of a {20-21} plane, a {10-11} plane, a {20-2-1} plane, and a {10-1-1} plane, toward an m-plane. By this fabricating method, the first and second end faces can be provided with flatness and perpendicularity enough to construct the laser cavity of the III-nitride semiconductor laser device, on the slight slant surface from any one of these typical semipolar planes.

In the fabricating method according to the foregoing aspect of the present invention, the substrate can comprise any one of GaN, AlGaN, AlN, InGaN, and InAlGaN. This fabricating method allows the first and second end faces applicable to the cavity to be obtained through the use of the substrate that comprises one of these GaN-based semiconductors.

In the fabricating method according to the foregoing aspect of the present invention, an end face of the active layer in each of the first and second end faces can make an angle in the range of not less than (ALPHA−5) degrees and not more than (ALPHA+5) degrees, defined on a first plane defined by the c-axis and the m-axis of the hexagonal III-nitride semiconductor, with respect to a reference plane perpendicular to the m-axis of the substrate. This fabricating method allows the formation of the end faces with the foregoing perpendicularity, defined in the angle taken from one to the other of the c-axis and the m-axis, in excellent yield.

In the fabricating method according to the foregoing aspect of the present invention, the angle can be in the range of not less than −5 degrees and not more than +5 degrees on a second plane which is perpendicular to the first plane and the normal axis to the semipolar primary surface. This fabricating method allows the formation of the end faces with the foregoing perpendicularity, defined in the angle formed on the plane perpendicular to the axis normal to the semipolar plane, in excellent yield.

In the fabricating method according to the foregoing aspect of the present invention, preferably, the angle ALPHA is in the range of not less than 63 degrees and not more than 80 degrees or in the range of not less than 100 degrees and not more than 117 degrees. In this fabricating method, when the angle is in the range of less than 63 degrees or in the range of more than 117 degrees, an m-plane can appear in part of an end face made by the press. When the angle is in the range of more than 80 degrees and less than 100 degrees, the desired flatness and perpendicularity are not achieved.

The fabricating method according to the foregoing aspect of the present invention can be configured as follows: the step of forming the scribed mark comprises scribing the first surface of the substrate product to form a plurality of scribed grooves extending in the direction of the a-axis of the hexagonal III-nitride semiconductor; the plurality of scribed grooves are arrayed at a pitch of n (n=1, 2, 3, 4, . . . ) times a device width in a direction intersecting with a direction of the laser cavity. Using the semipolar plane can improve quantum efficiency due to reduction of the piezoelectric field and improvement in crystal quality of the light emitting layer region.

In the fabricating method according to the foregoing aspect of the present invention, preferably, the thickness of the substrate is not less than 50 µm. In this fabricating method, when the thickness is not less than 50 µm, handling becomes easier and it can contribute to improvement in production yield.

In the fabricating method according to the foregoing aspect of the present invention, the thickness of the substrate can be not more than 400 µm. By this fabricating method, the fractured faces for the laser cavity can be obtained.

In the fabricating method according to the foregoing aspect of the present invention, the substrate can comprise any one of GaN, AlGaN, AlN, InGaN, and InAlGaN. In this fabricating method, when the substrate used is one which comprises any one of these GaN-based semiconductors, it becomes feasible to obtain the first and second end faces applicable to the cavity. Use of an AlN substrate or AlGaN substrate allows for increase in degree of polarization and enhancement of optical confinement by virtue of low refractive index. Use of an InGaN substrate allows for decrease in lattice mismatch rate between the substrate and the light emitting layer and improvement in crystal quality.

The fabricating method according to the foregoing aspect of the present invention can further comprise a step of forming a dielectric multilayer film on at least one of the first and second fractured faces. In this III-nitride semiconductor laser device, an end face coat is also applicable to the fractured faces and the end face coat allows for adjustment of reflectance.

In the fabricating method according to the foregoing aspect of the present invention, the active layer can include a light emitting region provided so as to generate light at a wavelength of not less than 360 nm and not more than 600 nm. Since this fabricating method makes use of the semipolar plane, the resultant device is the III-nitride semiconductor laser device making efficient use of polarization in the LED mode and achieves a low threshold current. The light emitting region can be, for example, any one of a single quantum well structure, a multiple quantum well structure, and a bulk structure.

In the fabricating method according to the foregoing aspect of the present invention, the active layer can include a quantum well structure provided so as to generate light at a wavelength of not less than 430 nm and not more than 550 nm. Since this fabricating method makes use of the semipolar plane, it allows for increase in quantum efficiency through both decrease of the piezoelectric field and improvement in crystal quality of the light emitting layer region, and it is thus suitable for generation of light at the wavelength of not less than 430 nm and not more than 550 nm.

In the fabricating method according to the foregoing aspect of the present invention, laser light from the active layer can be polarized in the direction of the a-axis of the hexagonal III-nitride semiconductor. In this fabricating method, a band transition allowing for achievement of a low threshold current has polarized nature. This transition can be used in the semiconductor laser device in which the c-axis is inclined toward the m-axis.

In the fabricating method according to the foregoing aspect of the present invention, light in the LED mode in the III-nitride semiconductor laser device includes a polarization component I1 in the direction of the a-axis of the hexagonal III-nitride semiconductor, and a polarization component I2 in a projected direction of the c-axis of the hexagonal III-nitride semiconductor on the primary surface, and the polarization component I1 is greater than the polarization component I2. Since this fabricating method provides the laser structure on the primary surface of the substrate the c-axis of which is inclined toward the m-axis, it allows light in a mode with large emission intensity in the LED mode to lase with the laser cavity.

In the fabricating method according to the foregoing aspect of the present invention, preferably, a stacking fault density of the support base is not more than $1 \times 10^4$ cm$^{-1}$. When the stacking fault density falls within this range, the flatness and/or perpendicularity of the fractured facets can be made less likely to be disturbed for a certain accidental reason.

In the fabricating method according to the foregoing aspect of the present invention, preferably, a ratio of the distance between the reference line and the center line to a length of the laser cavity is in the range of not less than ⅓ and not more than ⅔, on the first surface. In the fabricating method according to the foregoing aspect of the present invention, preferably, a ratio of a distance between the first edge and the second edge to the length of the laser cavity is in the range of not less than 5/3 and not more than 5/2.

A III-nitride semiconductor laser device according to another aspect of the present invention comprises: (a) a laser structure including a support base which comprises a hexagonal III-nitride semiconductor and has a semipolar primary surface, and a semiconductor region provided on the semipolar primary surface of the support base; and (b) an electrode provided on the semiconductor region of the laser structure. The semiconductor region comprises a first cladding layer comprising a first conductivity type GaN-based semiconductor, a second cladding layer comprising a second conductivity type GaN-based semiconductor, and an active layer provided between the first cladding layer and the second cladding layer; the first cladding layer, the second cladding layer, and the active layer are arranged along a normal axis to the semipolar primary surface; the c-axis of the hexagonal III-nitride semiconductor of the support base is inclined at an angle ALPHA with respect to the normal axis to the semipolar primary surface toward the m-axis of the hexagonal III-nitride semiconductor; the laser structure comprises first and second fractured faces intersecting with an m-n plane defined by the m-axis of the hexagonal III-nitride semiconductor and the normal axis to the semipolar primary surface; a laser cavity of the III-nitride semiconductor laser device comprises the first and second fractured faces; the laser structure comprises first and second surfaces; the first surface is a surface opposite to the second surface; each of the first and second fractured faces extends from an edge of the first surface to an edge of the second surface.

In the foregoing III-nitride semiconductor laser device, since the first and second fractured faces that form the laser cavity intersect with the m-n plane defined by the m-axis of the hexagonal III-nitride semiconductor and the normal axis, it is feasible to provide a laser waveguide extending in a direction of an intersecting line between the m-n plane and the semipolar plane. Therefore, the present invention succeeds in providing the III-nitride semiconductor laser device with the laser cavity enabling a low threshold current. According to Inventors' experiment, when the first and second fractured faces to constitute the laser cavity are formed by the fabricating method according to the present invention, the fractured faces have excellent flatness and the excellent flatness contributes to reduction in threshold current.

The above object and the other objects, features, and advantages of the present invention can more readily become clear in view of the following detailed description of the preferred embodiments of the present invention proceeding with reference to the accompanying drawings.

DETAILED DESCRIPTION OF THE PREFERRED EMBODIMENTS

Embodiments of the method for fabricating the III-nitride semiconductor laser device according to the present invention will be described with reference to the accompanying drawings. The same portions will be denoted by the same reference signs as much as possible.

The expertise of the present invention can be readily understood in view of the following detailed description with reference to the accompanying drawings provided by way of illustration only. The following will describe an embodiment of the method for fabricating the III-nitride semiconductor laser device according to the present invention, with reference to the accompanying drawings. The same portions will be denoted by the same reference signs as much as possible.

Figure 1:
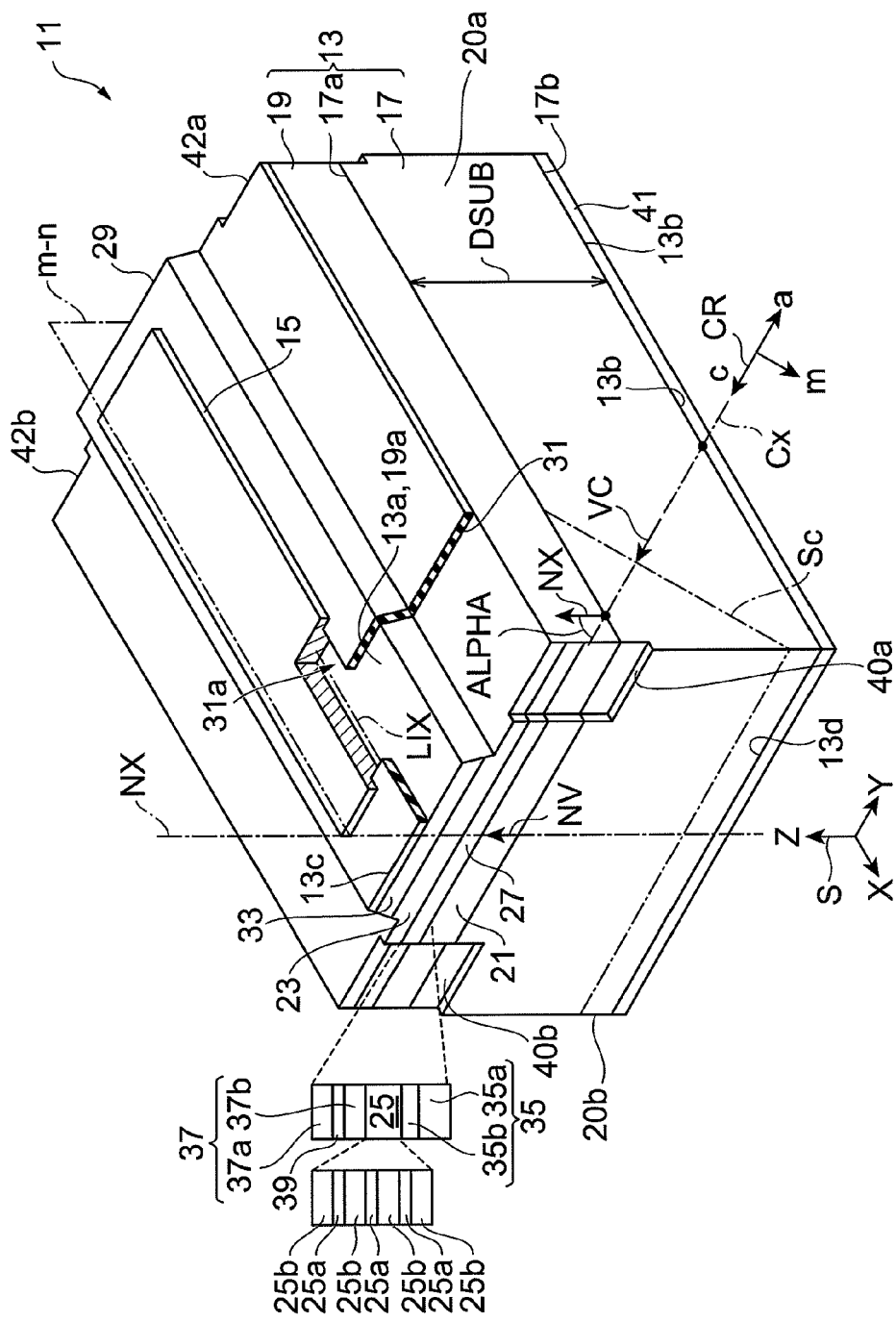
FIG. 1 is a drawing schematically showing a structure of a III-nitride semiconductor laser device according to an embodiment of the present invention.

FIG. 1 is a drawing schematically showing a structure of a III-nitride semiconductor laser device according to an embodiment of the present invention. The III-nitride semiconductor laser device 11 has a ridge structure, but embodiments of the present invention are not limited to the ridge structure. The III-nitride semiconductor laser device 11 has a laser structure 13 and an electrode 15. The laser structure 13 includes a support base 17 and a semiconductor region 19. The support base 17 comprises a hexagonal III-nitride semiconductor and has a semipolar primary surface 17a and a back surface 17b. The semiconductor region 19 is provided on the semipolar primary surface 17a of the support base 17. The electrode 15 is provided on the semiconductor region 19 of the laser structure 13. The semiconductor region 19 includes a first cladding layer 21, a second cladding layer 23, and an active layer 25. The first cladding layer 21 comprises a first conductivity type GaN-based semiconductor, e.g., n-type AlGaN, n-type InAlGaN, or the like. The second cladding layer 23 comprises a second conductivity type GaN-based semiconductor, e.g., p-type AlGaN, p-type InAlGaN, or the like. The active layer 25 is provided between the first cladding layer 21 and the second cladding layer 23. The active layer 25 includes GaN-based semiconductor layers and the GaN-based semiconductor layers can be, for example, well layers 25a. The active layer 25 includes barrier layers 25b which comprise a GaN-based semiconductor, and the well layers 25a and the barrier layers 25b are alternately arranged. The well layers 25a comprise, for example, of InGaN or the like, and the barrier layers 25b comprise, for example, GaN, InGaN, or the like. The active layer 25 can include a quantum well structure provided so as to generate light at the wavelength of not less than 360 nm and not more than 600 nm. Use of a semipolar plane is suitable for generation of light at the wavelength of not less than 430 nm and not more than 550 nm. The first cladding layer 21, the second cladding layer 23, and the active layer 25 are arranged along a normal axis NX normal to the semipolar primary surface 17a. In the III-nitride semiconductor laser device 11, the laser structure 13 includes a first fractured face 27 and a second fractured face 29 which intersect with an m-n plane defined by the normal axis NX and the m-axis of the hexagonal III-nitride semiconductor.

Referring to FIG. 1, an orthogonal coordinate system S and a crystal coordinate system CR are depicted. The normal axis NX is directed along a direction of the Z-axis of the orthogonal coordinate system S. The semipolar primary surface 17a extends in parallel with a predetermined plane defined by the X-axis and the Y-axis of the orthogonal coordinate system S. In FIG. 1, a typical c-plane Sc is also depicted. The c-axis of the hexagonal III-nitride semiconductor of the support base 17 is inclined at a nonzero angle ALPHA with respect to the normal axis NX toward the m-axis of the hexagonal III-nitride semiconductor.

The III-nitride semiconductor laser device 11 further comprises an insulating film 31. The insulating film 31 covers a surface 19a of the semiconductor region 19 of the laser structure 13, and the semiconductor region 19 is located between the insulating film 31 and the support base 17. The support base 17 comprises a hexagonal III-nitride semiconductor. The insulating film 31 has an aperture 31a, and the aperture 31a extends in a direction of an intersecting line LIX between the surface 19a of the semiconductor region 19 and the foregoing m-n plane and has, for example, a stripe shape. The electrode 15 is in contact with the surface 19a of the semiconductor region 19 (e.g., a contact layer 33 of the second conductivity type) through the aperture 31a, and extends in the direction of the foregoing intersecting line LIX. In the III-nitride semiconductor laser device 11, a laser waveguide includes the first cladding layer 21, the second cladding layer 23 and the active layer 25, and extends in the direction of the foregoing intersecting line LIX.

In the III-nitride semiconductor laser device 11, the first fractured face 27 and the second fractured face 29 intersect with the m-n plane defined by the normal axis NX and the m-axis of the hexagonal III-nitride semiconductor. A laser cavity of the III-nitride semiconductor laser device 11 includes the first and second fractured faces 27 and 29, and the laser waveguide extends from one to the other of the first fractured face 27 and the second fractured face 29. The laser structure 13 includes a first surface 13a and a second surface 13b, and the first surface 13a is a surface opposite to the second surface 13b. The first and second fractured faces 27 and 29 each extend from an edge 13c of the first surface 13a to an edge 13d of the second surface 13b. The first and second fractured faces 27 and 29 are different from the conventional cleaved facets such as c-planes, m-planes, or a-planes.

In this III-nitride semiconductor laser device 11, the first and second fractured faces 27 and 29 that form the laser cavity intersect with the m-n plane. This allows for provision of the laser waveguide extending in the direction of the intersecting line between the m-n plane and the semipolar plane 17a. Accordingly, the III-nitride semiconductor laser device 11 has the laser cavity that enables a low threshold current.

In the III-nitride semiconductor laser device 11, the fractured face 27 has a first recess 40a. The first recess 40a extends in the direction from the first surface 13a to the second surface 13b, along the a-n plane defined by the normal axis NX and the direction of the a-axis and along a side face 20a (which is different from the fractured faces 27 and 29) of the III-nitride semiconductor laser device 11. This first recess 40a is formed of a scribed mark by fracture. The scribed mark extending in the direction from the first surface (epitaxial surface) 13a toward the support base 17 along the a-n plane guides directions of propagation of fracture. The first recess 40a is provided from the epitaxial surface into the support base 17. Furthermore, the first fractured face 27 has a second recess 40b, and the second recess 40b extends in the direction from the first surface 13a to the second surface 13b. The second recess 40b extends along the a-n plane and along a side face 20b (which is different from the fractured faces 27 and 29) of the III-nitride semiconductor laser device 11. An end face of the optical waveguide (e.g., the end face of the active layer 25) appears in the first fractured face 27, and the end face of the active layer 25 in the first fractured face 27 is located between the recesses 40a and 40b. Each of these recesses 40a and 40b is formed of a scribed mark by fracture. These scribed marks extending in the direction from the first surface (epitaxial surface) 13a toward the support base 17 along the a-n plane can guide the directions of propagation of fracture. The fractured face 29 can also have recesses 42a and 42b similar to those of the fractured face 27.

As shown in FIG. 1, the III-nitride semiconductor laser device 11 has a ridge structure. In the ridge structure, the second conductivity type contact layer 33 has a stripe shape, and the second cladding layer 23 includes a flat portion covering the underlying semiconductor layer, and a ridge portion forming a stripe shape similar to the shape of the second conductivity type contact layer 33. The III-nitride semiconductor laser device 11 includes an n-side optical guide layer 35 and a p-side optical guide layer 37. The n-side optical guide layer 35 includes a first portion 35a and a second portion 35b, and the n-side optical guide layer 35 comprises, for example, GaN, InGaN, or the like. The p-side optical guide layer 37 includes a first portion 37a and a second portion 37b, and the p-side optical guide layer 37 comprises, for example, GaN, InGaN, or the like. A carrier block layer 39 is provided, for example, between the first portion 37a and the second portion 37b. Another electrode 41 is provided on the back surface 17b of the support base 17, and this electrode 41 covers, for example, the back surface 17b of the support base 17.

Figure 2:
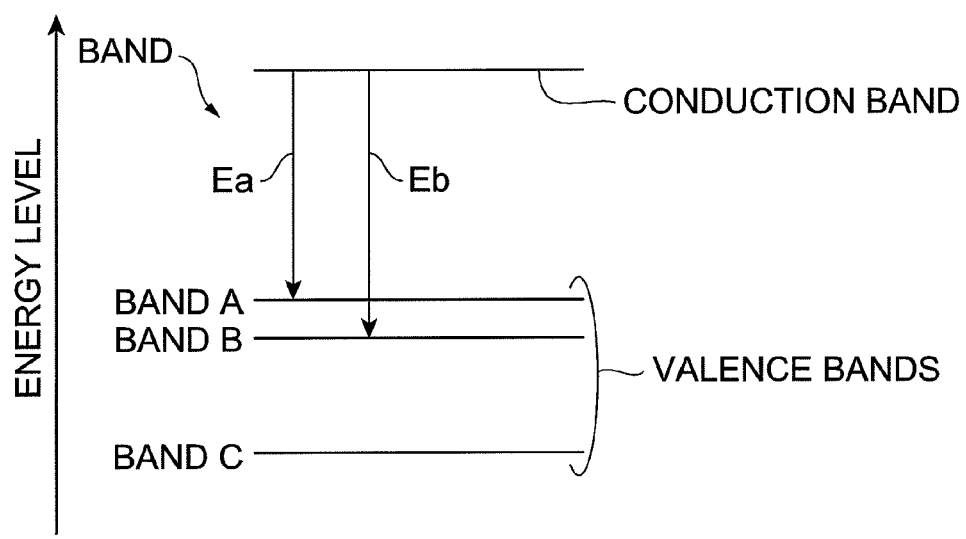
FIG. 2 is a drawing showing a band structure in an active layer in the III-nitride semiconductor laser device.
Figure 2:
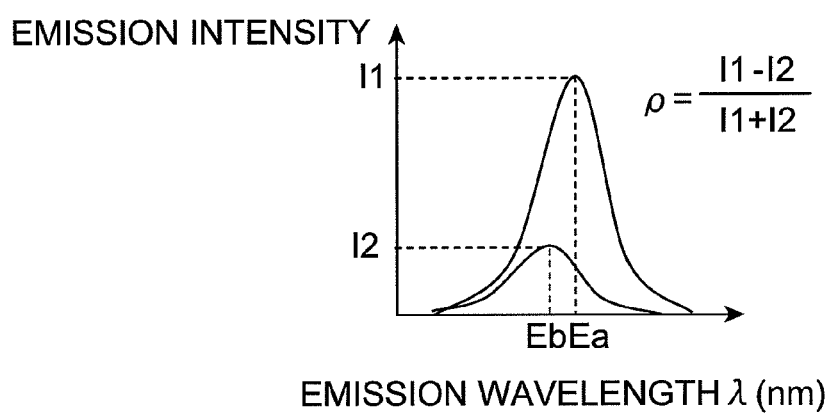
Figure 3:
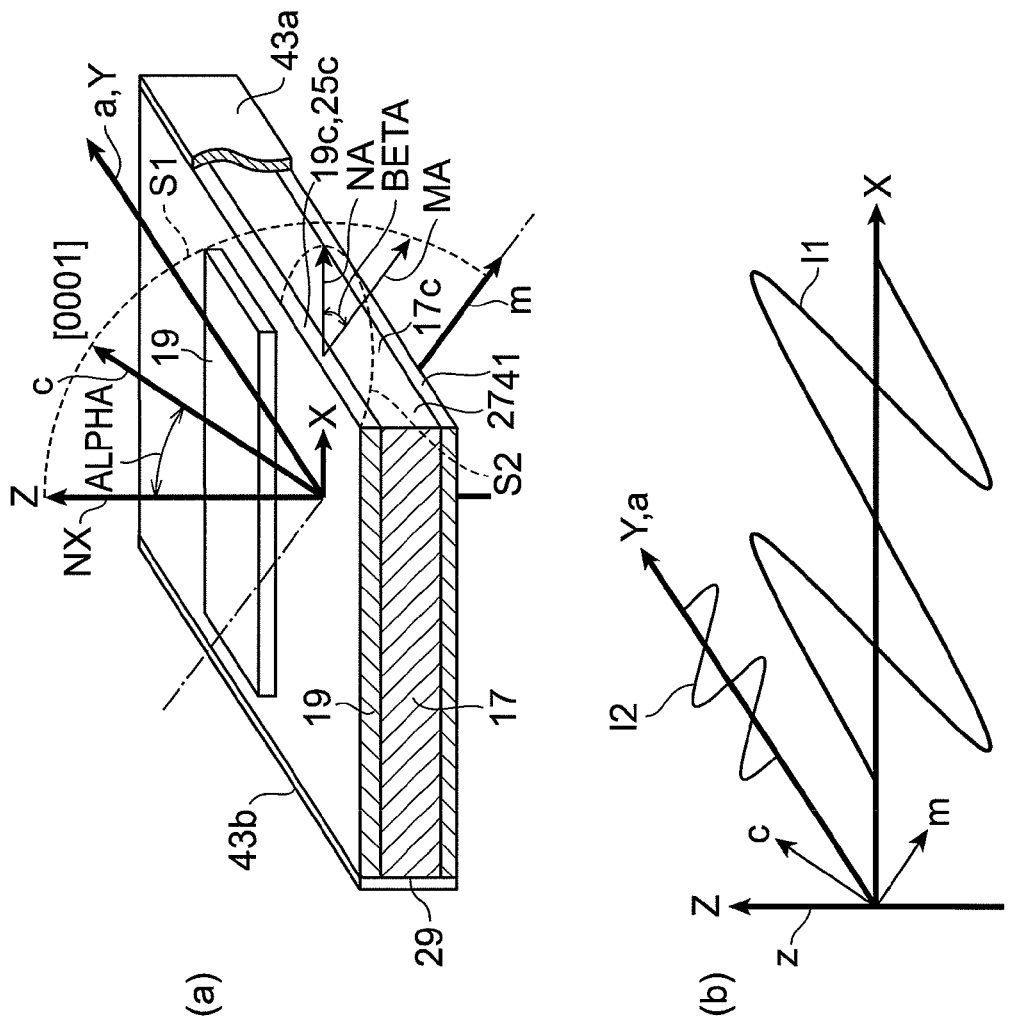
FIG. 3 is a drawing showing polarization of emission in the active layer of the III-nitride semiconductor laser device.
Figure 4:
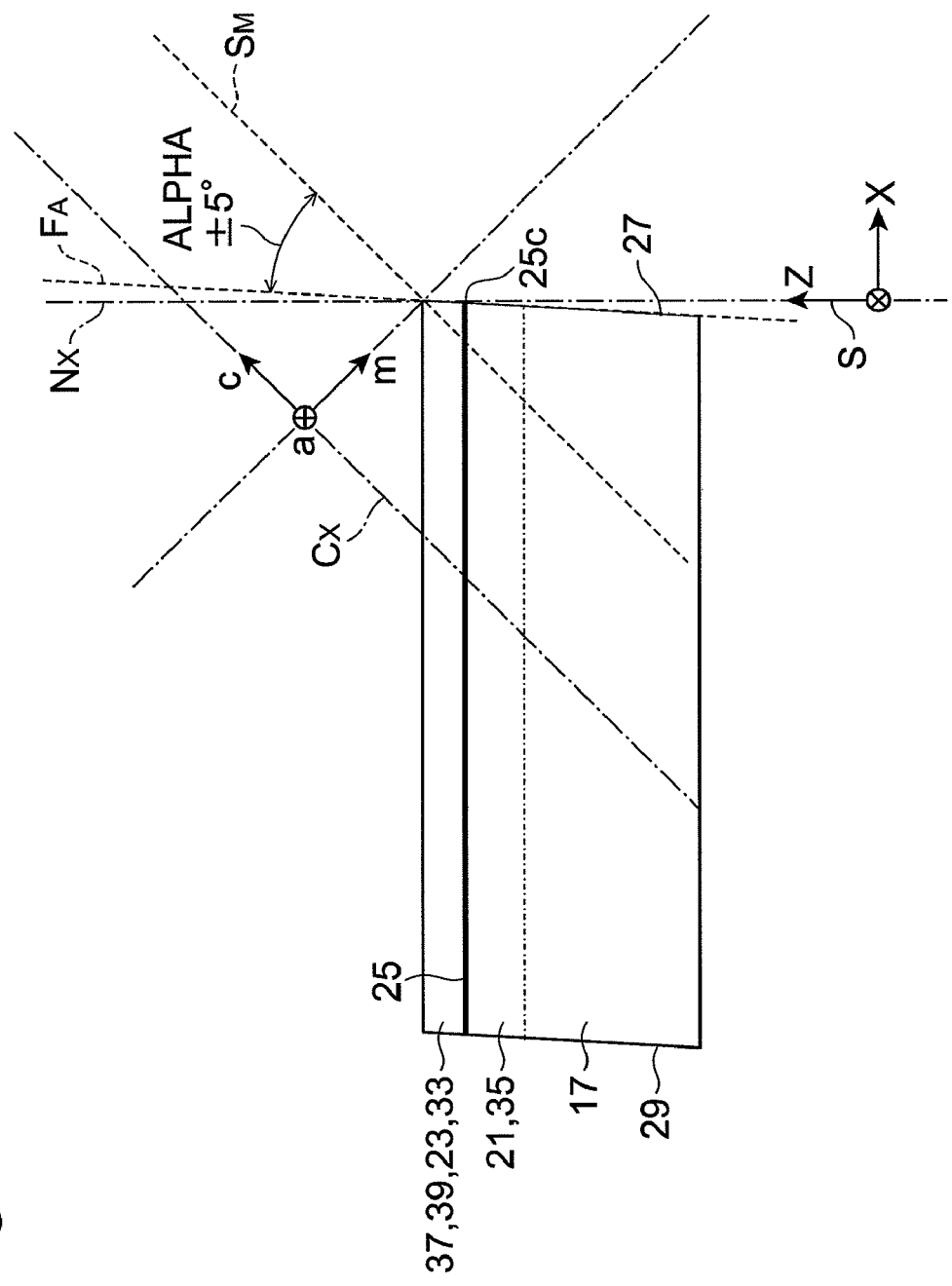
FIG. 4 is a drawing showing a relation between an end face of the III-nitride semiconductor laser device and an m-plane of the active layer.

FIG. 2 is a drawing showing a band structure in the active layer in the III-nitride semiconductor laser device. FIG. 3 is a drawing showing polarization of emission in the active layer 25 of the III-nitride semiconductor laser device 11. FIG. 4 is a drawing schematically showing a cross section defined by the c-axis and the m-axis. With reference to part (a) of FIG. 2, there are three possible transitions between the conduction band and valence bands in the vicinity of Γ point of the band structure BAND. There is a relatively small energy difference between band A and band B. An emission by transition Ea between the conduction band and band A is polarized in the a-axis direction, and an emission by transition Eb between the conduction band and band B is polarized in the direction of the projected c-axis onto the primary surface. Concerning lasing, a threshold of transition Ea is smaller than a threshold of transition Eb.

With reference to part (b) of FIG. 2, there are shown spectra of light in the LED mode in the III-nitride semiconductor laser device 11. The light in the LED mode includes a polarization component I1 in the direction of the a-axis of the hexagonal III-nitride semiconductor, and a polarization component I2 in the direction of the c-axis, projected on the primary surface, of the hexagonal III-nitride semiconductor, and the polarization component I1 is larger than the polarization component I2. Degree of polarization ρ is defined by (I1−I2)/(I1+I2). By use of the laser cavity of the III-nitride semiconductor laser device 11, the device can be lased to emit light in a mode with large emission intensity in the LED mode.

As shown in FIG. 3, the device may be further provided with dielectric multilayer film 43a, 43b on at least one of the first and second fractured faces 27, 29 or with both on the respective faces. An end face coat is also applicable to the fractured faces 27, 29. The end face coat allows adjustment of reflectance.

As shown in part (b) of FIG. 3, the laser light L from the active layer 25 is polarized in the direction of the a-axis of the hexagonal III-nitride semiconductor. In this III-nitride semiconductor laser device 11, a band transition allowing for implementation of a low threshold current has polarized nature. The first and second fractured faces 27, 29 for the laser cavity are different from the conventional cleaved facets such as c-planes, m-planes, or a-planes. However, the first and second fractured faces 27, 29 have flatness and perpendicularity enough as mirrors for the cavity. For this reason, by using the first and second fractured faces 27, 29 and the laser waveguide extending between these fractured faces 27, 29, as shown in part (b) of FIG. 3, it becomes feasible to achieve low-threshold lasing through the use of the emission (I1) by transition Ea stronger than the emission (I2) by transition Eb polarized in the projected direction of the c-axis on the primary surface.

In the III-nitride semiconductor laser device 11, as shown in part (a) of FIG. 3, an end face 17c of the support base 17 and an end face 19c of the semiconductor region 19 are exposed in each of the first and second fractured faces 27, 29, and the end face 17c and the end face 19c are covered by the dielectric multilayer film 43a. An angle BETA between a normal vector NA to the end face 17c of the support base 17 and an end face 25c in the active layer 25, and an m-axis vector MA of the active layer 25 is defined by component $(BETA)_1$ defined on a first plane S1 defined by the c-axis and m-axis of the III-nitride semiconductor, and component $(BETA)_2$ defined on a second plane S2 perpendicular to the first plane S1 and the normal axis NX. The component $(BETA)_1$ is preferably in the range of not less than (ALPHA−5) degrees and not more than (ALPHA+5) degrees on the first plane S1 defined by the c-axis and m-axis of the III-nitride semiconductor. This angle range is shown as an angle between a typical m-plane (standard plane orthogonal to the m-axis) $S_M$ and a reference plane $F_A$ in FIG. 4. The typical m-plane $S_M$ is depicted from the inside to the outside of the laser structure in FIG. 4, for easier understanding. The reference plane $F_A$ extends along the end face 25c of the active layer 25. This III-nitride semiconductor laser device 11 has the end faces satisfying the aforementioned perpendicularity, as to the angle BETA taken from one to the other of the c-axis and the m-axis. The component $(BETA)_2$ is preferably in the range of not less than −5 degrees and not more than +5 degrees on the second plane S2. Here, $BETA^2=(BETA)_1{}^2+(BETA)_2{}^2$. In this case, the end faces 27, 29 of the III-nitride semiconductor laser device 11 satisfy the aforementioned perpendicularity as to the angle defined on the plane perpendicular to the normal axis NX to the semipolar plane 17a.

Referring again to FIG. 1, in the III-nitride semiconductor laser device 11 the thickness DSUB of the support base 17 is preferably not more than 400 μm. This III-nitride semiconductor laser device is suitable for obtaining good-quality fractured faces for the laser cavity. In the III-nitride semiconductor laser device 11, the thickness DSUB of the support base 17 is more preferably not less than 50 μm and not more than 160 μm. This III-nitride semiconductor laser device 11 is more suitable for obtaining good-quality fractured faces for the laser cavity. Furthermore, handling becomes easier and the production yield becomes higher.

In the III-nitride semiconductor laser device 11, the angle ALPHA between the normal axis NX and the c-axis of the hexagonal III-nitride semiconductor is preferably not less than 45 degrees and preferably not more than 80 degrees. Furthermore, the angle ALPHA is preferably not less than 100 degrees and preferably not more than 135 degrees. When the angle is in the range of less than 45 degrees or in the range of more than 135 degrees, the end faces made by press are highly likely to be comprised of m-planes. When the angle is in the range of more than 80 degrees and less than 100 degrees, it could result in failing to achieve the desired flatness and perpendicularity.

In the III-nitride semiconductor laser device 11, more preferably, the angle ALPHA between the normal axis NX and the c-axis of the hexagonal III-nitride semiconductor is not less than 63 degrees and not more than 80 degrees. Furthermore, the angle ALPHA is more preferably not less than 100 degrees and not more than 117 degrees. When the angle is in the range of less than 63 degrees or in the range of more than 117 degrees, an m-plane can appear in part of an end face made by press. When the angle is in the range of more than 80 degrees and less than 100 degrees, it could result in failing to achieve the desired flatness and perpendicularity.

The semipolar primary surface 17a can be any one of a {20-21} plane, a {10-11} plane, a {20-2-1} plane, and a {10-1-1} plane. Furthermore, a surface with a slight slant in the range of not less than −4 degrees and not more than +4 degrees from these planes is also suitable for the primary surface. On the semipolar surface 17a of one of these typical planes, it is feasible to provide the first and second end faces 27, 29 with flatness and perpendicularity enough to construct the laser cavity of the III-nitride semiconductor laser device 11. Furthermore, the end faces with sufficient flatness and perpendicularity are obtained in an angular range across these typical plane orientations.

In the III-nitride semiconductor laser device 11, the stacking fault density of the support base 17 can be not more than $1 \times 10^4$ cm$^{-1}$. Since the stacking fault density is not more than $1 \times 10^4$ cm$^{-1}$, the flatness and/or perpendicularity of the fractured faces is less likely to be disturbed for a certain accidental reason. The stacking fault density of the support base 17 can be estimated by observing the substrate before the growth by the cathodoluminescence method. The cathodoluminescence is to observe an emission process of carriers excited by an electron beam and if there is a stacking fault, non-radiative recombination of carriers occurs in the vicinity thereof to be observed as a dark line. For example, the stacking fault density can be defined as a density (line density) per unit length of dark lines. The cathodoluminescence method of nondestructive measurement is applied herein in order to check the stacking fault density, but it is also possible to use a transmission electron microscope of destructive measurement. When a cross section of a sample is observed from the a-axis direction with the transmission electron microscope, a defect extending in the m-axis direction from the substrate toward the sample surface is a stacking fault included in the support base and the line density of stacking faults can be determined in the same manner as in the case of the cathodoluminescence method.

The support base 17 can be comprised of any one of GaN, AlN, AlGaN, InGaN, and InAlGaN. When the substrate comprised of any one of these GaN-based semiconductors is used, the end faces 27, 29 applicable to the cavity can be obtained. When an AlN or AlGaN substrate is used, it is feasible to increase the degree of polarization and to enhance optical confinement by virtue of low refractive index. When an InGaN substrate is used, it is feasible to decrease the lattice mismatch rate between the substrate and the light emitting layer and to improve crystal quality.

Figure 5:
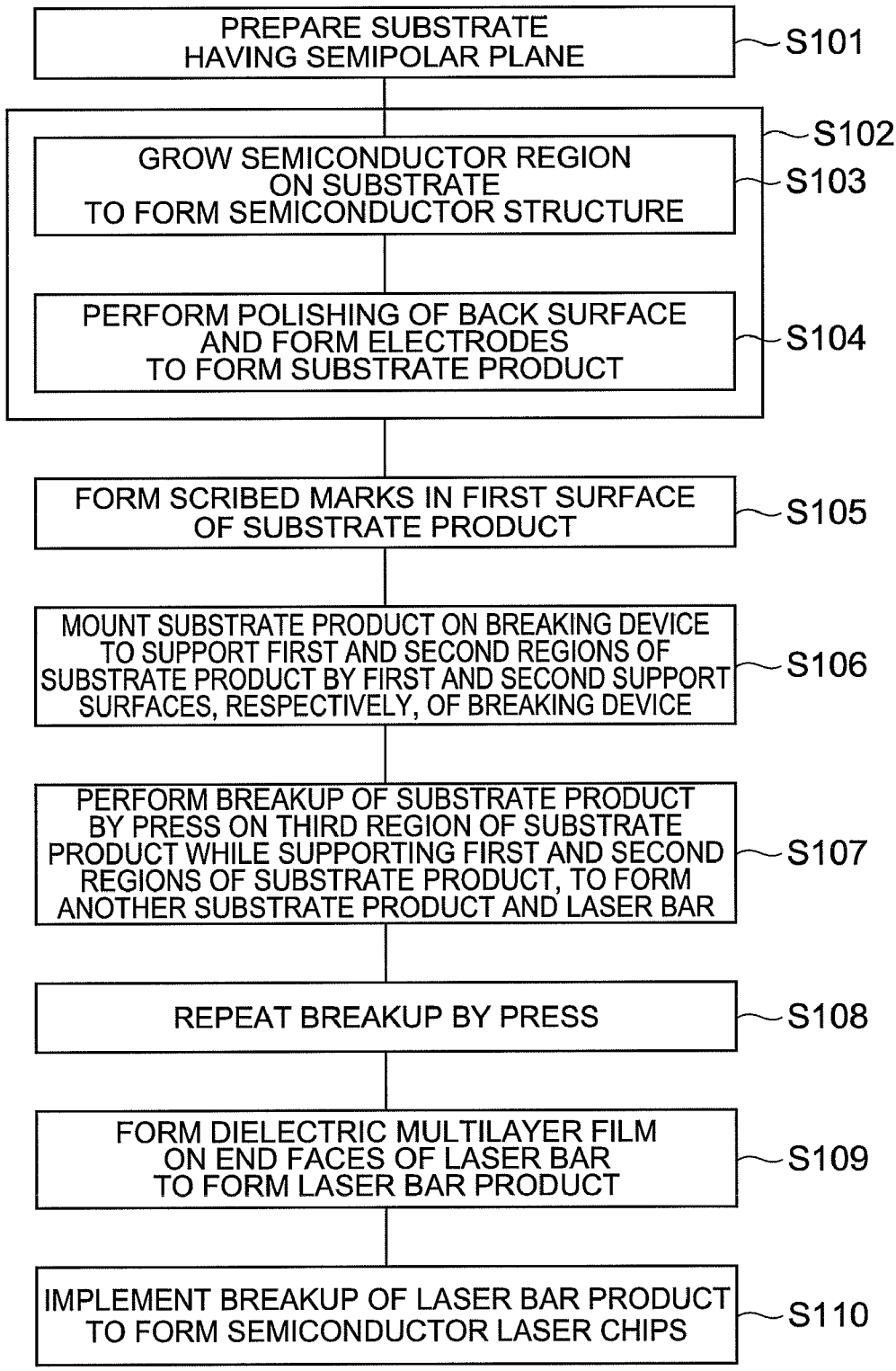
FIG. 5 is a step flowchart showing major steps in a method for fabricating a III-nitride semiconductor laser device according to an embodiment of the present invention.

FIG. 5 is a drawing showing major steps in a method for fabricating a III-nitride semiconductor laser device according to an embodiment of the present invention. With reference to part (a) of FIG. 6, a substrate 51 is shown. Step S101 is to prepare the substrate 51 for fabrication of the III-nitride semiconductor laser device. The c-axis (vector VC) of the hexagonal III-nitride semiconductor of the substrate 51 is inclined at the angle ALPHA with respect to the normal axis NX toward the m-axis (vector VM) of the hexagonal III-nitride semiconductor. For this reason, the substrate 51 has a semipolar primary surface 51a comprised of the hexagonal III-nitride semiconductor.

Step S102 is to form a substrate product SP. In part (a) of FIG. 6, the substrate product SP is depicted as a member of a nearly disklike shape, but the shape of the substrate product SP is not limited to this. For obtaining the substrate product SP, step S103 is first carried out to form a laser structure 55. The laser structure 55 includes a semiconductor region 53 and the substrate 51 and step S103 is to form the semiconductor region 53 on the semipolar primary surface 51a. For forming the semiconductor region 53, a first conductivity type GaN-based semiconductor region 57, a light emitting layer 59, and a second conductivity type GaN-based semiconductor region 61 are grown in order on the semipolar primary surface 51a. The GaN-based semiconductor region 57 can include, for example, an n-type cladding layer and the GaN-based semiconductor region 61 can include, for example, a p-type cladding layer. The light emitting layer 59 is provided between the GaN-based semiconductor region 57 and the GaN-based semiconductor region 61 and can include an active layer, optical guide layers, an electron block layer, and so on. The first conductivity type GaN-based semiconductor region 57, the light emitting layer 59, and the second conductivity type GaN-based semiconductor region 61 are arranged along the normal axis NX to the semipolar primary surface 51a. These semiconductor layers are epitaxially grown. The surface of the semiconductor region 53 is covered by an insulating film 54. The insulating film 54 is comprised, for example, of silicon oxide. The insulating film 54 has an aperture 54a. The aperture 54a is, for example, a stripe shape.

Step S104 is to form an anode electrode 58a and a cathode electrode 58b on the laser structure 55. Before forming the electrode on the back surface of the substrate 51, the back surface of the substrate used in crystal growth is polished to form a substrate product SP in a desired thickness DSUB. In formation of the electrodes, for example, the anode electrode 58a is formed on the semiconductor region 53 and the cathode electrode 58b is formed on the back surface (polished surface) 51b of the substrate 51. The anode electrode 58a extends in the X-axis direction and the cathode electrode 58b covers the entire area of the back surface 51b. These steps result in forming the substrate product SP. The substrate product SP includes a first surface 63a, and a second surface 63b located opposite thereto. The semiconductor region 53 is located between the first surface 63a and the substrate 51.

Figure 6:
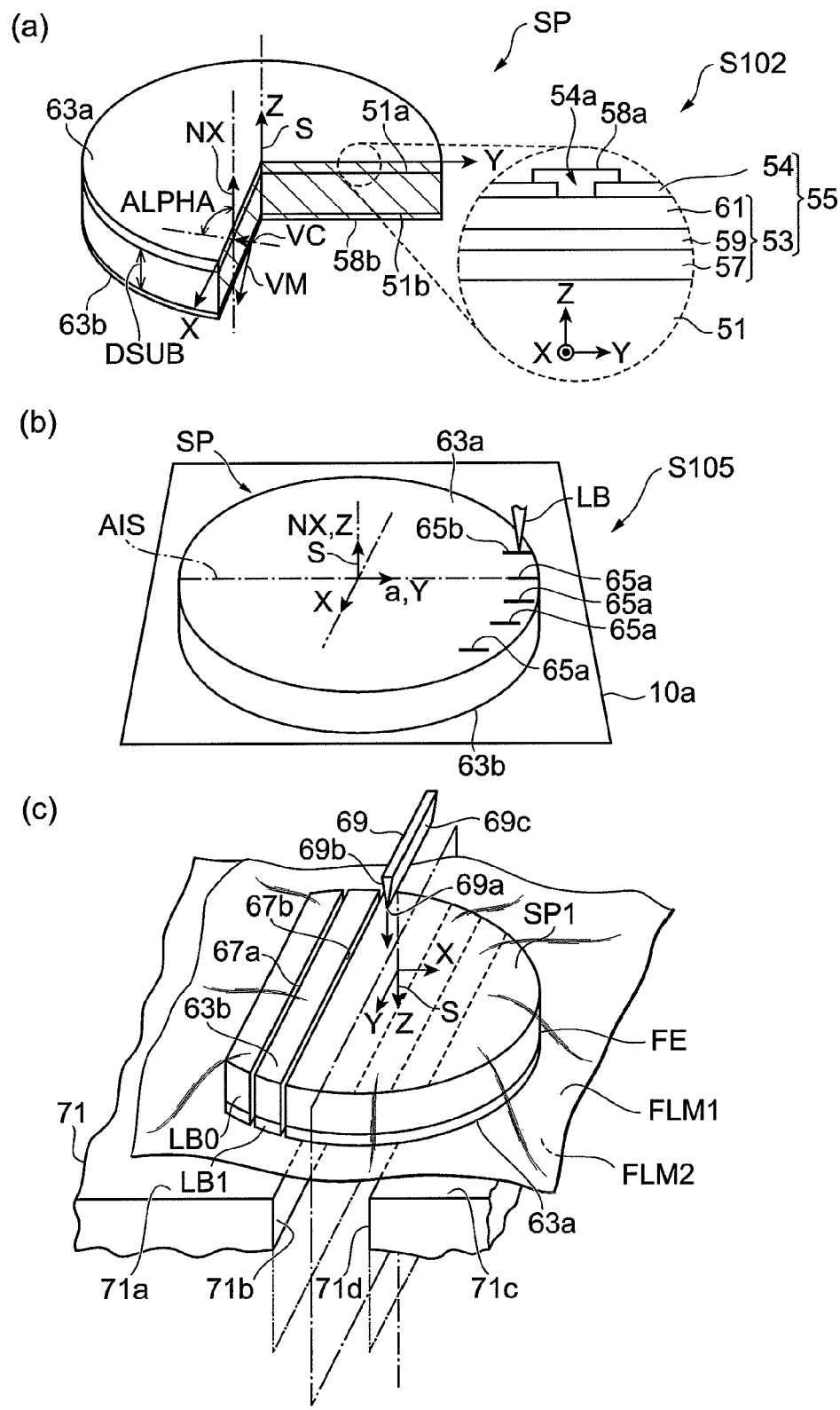
FIG. 6 is a drawing schematically showing major steps in the method for fabricating the III-nitride semiconductor laser device according to the embodiment.

Step S105 is, as shown in part (b) of FIG. 6, to scribe the first surface 63a of the substrate product SP. This scribing step is carried out with a laser scriber 10a. This scribing step results in forming scribed grooves 65a. In part (b) of FIG. 6, five scribed grooves are already formed and formation of a scribed groove 65b is in progress with a laser beam LB. The length of the scribed grooves 65a is shorter than the length of an intersecting line AIS between the a-n plane defined by the a-axis of the hexagonal III-nitride semiconductor and the normal axis NX, and the first surface 63a, and the laser beam LB is applied to a part of the intersecting line AIS. By the application with the laser beam LB, grooves extending in the specific direction and reaching the semiconductor region are formed in the first surface 63a. The scribed grooves 65a can be formed, for example, at an edge of the substrate product SP. The scribed grooves 65a extend in the direction from the first surface 63a to the second surface 63b along the normal axis and a-n plane. The scribed grooves 65a extend in the direction from the first surface 63a toward the substrate 51. Another substrate product and a laser bar are formed from the substrate product SP by press on the substrate product SP and propagation of the fracture is guided by the scribed grooves 65a extending in the aforementioned depth direction. In part (b) of FIG. 6, the substrate product is depicted in the disk-like shape, but the shape of the substrate product is not limited to this.

Figure 7:
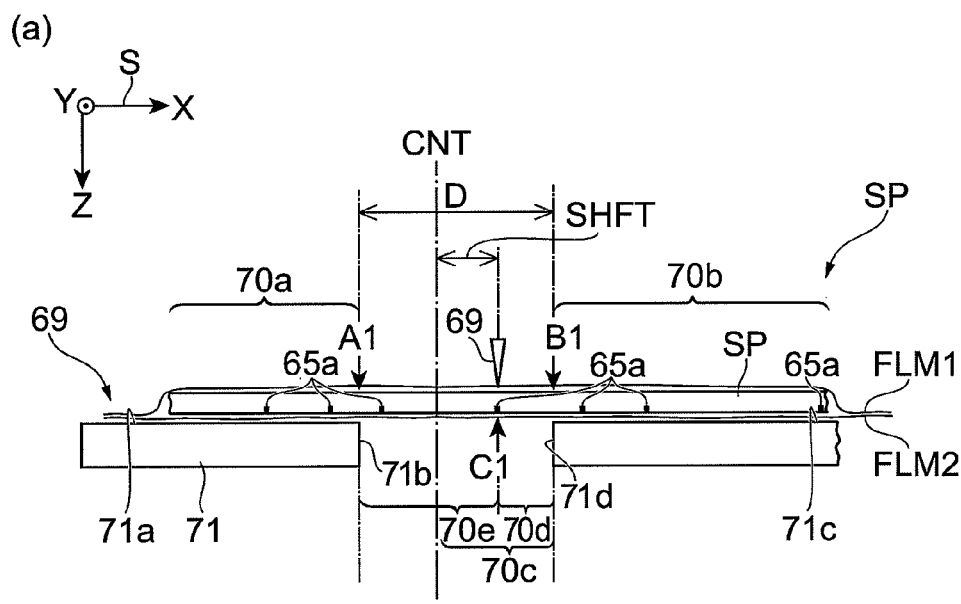
FIG. 7 is a drawing illustrating method (A) of fracture in the method for fabricating the III-nitride semiconductor laser device according to the embodiment.
Figure 7:
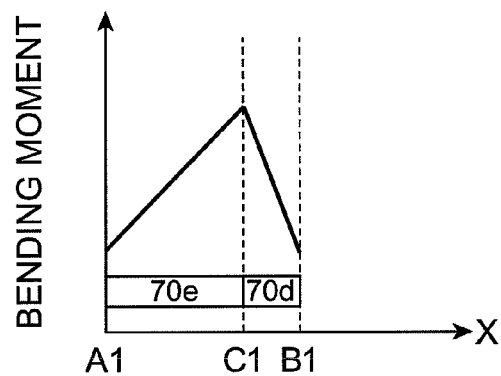

After forming the scribed grooves 65a, step S106 is carried out, as shown in part (a) of FIG. 7, to mount the substrate product on a breaking device 71 to support first and second regions 70a, 70b of the substrate product SP by first and second support portions 71a, 71c, respectively, of the breaking device 71. A first edge (e.g., an edge of a support surface) 71b of the first support portion 71a is separated from a second edge (e.g., an edge of a support surface) 71d of the second support portion 71c. A third region 70c is provided between the first and second regions 70a, 70b of the substrate product SP and the breaking device 71 does not support the third region 70c. Before mounted, the substrate product SP is placed between two films with flexibility (e.g., flexible films) FLM1, FLM2 and the flexible films applicable herein are, for example, polyvinyl chloride films or the like. In the arrangement shown in part (a) of FIG. 7, a blade 69 is aligned with an inside scribed groove 65a in the substrate product SP of the larger size, in order to form a substrate product of a smaller size by breaking the substrate product SP of the larger size. In the present embodiment, the third region 70c includes two scribed grooves 65a.

In part (c) of FIG. 6, a laser bar LB0 is already formed. Step S107 is to carry out breakup of the substrate product by press in alignment with a mark of a desired scribed groove 65a and thereby form another substrate product SP1 and a laser bar LB1. The press is implemented using a breaking tool, e.g., the blade 69. The breaking tool includes an edge 69a extending in one direction, and at least two blade faces 69b, 69c defining the edge 69a. The press on the substrate product SP1 is carried out on the support device 71. The support device 71 includes support surfaces and edges 71b, 71d of support members 71a, 71c and the support surfaces end at the edges 71b, 71d. In part (c) of FIG. 6, the substrate product is supported so that the laser bars successively formed are located on the support surface 71a.

In step S107, as shown in part (c) of FIG. 6, breakup of the substrate product is brought about by press against the second surface 63b of this substrate product, to form a substrate product SP1 and a laser bar LB1. The orientation of the scribed groove 65a of the substrate product SP1 is aligned with the extending direction of the edges 71b, 71d of the support device 71 and the substrate product SP is positioned on the basis of the edges 71b, 71d of the support device 71. The scribed groove 65a to cause next fracture is not positioned on the support surfaces 71a, 71c.

The foregoing breakup will be described below with reference to part (a) of FIG. 7. In this form, the third region 70c includes two lines of scribed grooves 65a. The substrate product SP is divided into the first region 70a, second region 70b, and third region 70c with respect to reference lines (X-coordinates A1, B1) extending along the edges 71b, 71d. In the substrate product SP, the first region 70a and the second region 70b are adjacent to the third region 70c, and the third region 70c is located between the first region 70a and the second region 70b.

The press is implemented on the third region 70c while supporting the first and second regions 70a, 70b by the support device 71 but not supporting the third region 70c. The direction of the edge 69a of the breaking tool is aligned with the extending direction of the edge 71b and the edge 69a of the breaking tool is pressed on the substrate product SP from a direction intersecting with the second surface 63b. The intersecting direction is preferably a direction substantially perpendicular to the second surface 63b. The press results in breaking the substrate product to form the other substrate product SP1 and the laser bar LB1. The laser bar LB1 produced as described above by the press has first and second end faces 67a, 67b and the end faces of the laser waveguide in these end faces 67a, 67b have perpendicularity and flatness enough to be applicable to the cavity mirrors of the semiconductor laser.

A laser bar producing method will be described with reference to part (a) of FIG. 7. In the laser bar producing method shown in part (a) of FIG. 7 (which will be referred to as "method A"), the substrate product SP consists of the three regions 70a, 70b, 70c separated by the first and second reference lines (X-coordinates A1, B1). After formation of the scribed marks in this substrate product SP, the substrate product SP is positioned on the support device of breaking device 71 so as not to support the face of coordinates (near X-coordinate C1) on the surface 63a where the scribed marks are formed, by the support surfaces 71a, 71c. The substrate product SP is mounted on the support device 71 so that the reference lines (X-coordinates A1, B1) are separated from a center line CNT which defines a center between the first edge 71b and the second edge 71d. After the positioning, the breakup of the substrate product SP is brought about by press along the press line (X-coordinate C1) in the central region 70c of the substrate product SP while supporting the two-side regions 70a, 70b of the substrate product SP, whereby the other substrate product SP1 and the laser bar LB1 are formed as shown in part (c) of FIG. 6. In the supporting process prior to the foregoing press, the regions 70a, 70b of the substrate product SP are supported, while the third region 70c of the substrate product SP is not supported. For this reason, the third region 70c becomes bent in downwardly convex shape during the press.

When the press process is carried out to implement the press with the blade edge in alignment with the press line in the region 70c, the third region 70c is divided into two portions with respect to the press line and there are different force distributions in these two portions, as understood from the description below. For explaining this, the third region 70c is divided into first and second portions 70d, 70e with respect to the press line (X-coordinate C1) and the first portion 70d in the third region 70c is adjacent to the second portion 70e and the second region 70b and is located between them. The foregoing press applies shear force to the boundary (press line) between the first portion 70e and the second portion 70d. During the period of the press, the bending moment and shear force both act on the second portion 70e between the supported first region 70a and the press line on the third region 70c of the substrate product SP, whereas the bending moment and shear force both act on the first portion 70d between the supported second region 70b and the press line on the third region 70c of the substrate product SP. The bending moment distribution in the first portion 70d is different from that in the second portion 70e, and the bending moment is asymmetric with respect to the press line.

In this method, the substrate product SP is divided into the first and second regions 70a, 70b of the substrate product SP to be supported during the breakup, and the third region 70c of the substrate product SP to be pressed without being supported during the breakup. The substrate product SP is mounted on the breaking device 71 so that the reference lines (X-coordinates A1, B1) are separated from the center line CNT defining the center between the first edge 71b and the second edge 71d. The shear force by the press is exerted at the press line (X-coordinate C1) at the position apart from the foregoing center line CNT. When this press is implemented, different forces are applied to the two portions 70d, 70e of the third region 70c separated with respect to the reference line (X-coordinate C1) along the press line. The bending moment distribution in the first portion 70d is different from that in the second portion 70e. The shear force is exerted at the press line, while the bending moment distributions are made asymmetric with respect to the press line. This method improves the flatness of the cavity mirrors in the III-nitride semiconductor laser device.

By this fracture method, improvement is made in flatness of the cavity mirrors and the forces for fracture include the shear force and bending moment. It is assumed in part (b) of FIG. 7 that the bending moment linearly varies in the substrate product, for easier understanding, but there is no need for limiting the variation in bending moment to it.

Figure 8:
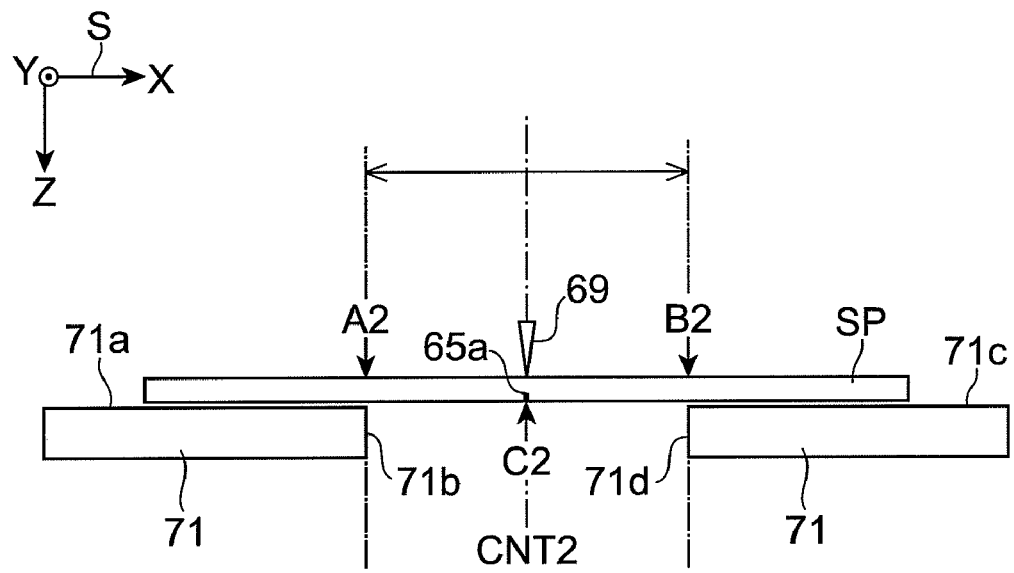
FIG. 8 is a drawing illustrating method (B) of fracture in the method for fabricating the III-nitride semiconductor laser device according to the embodiment.
Figure 8:
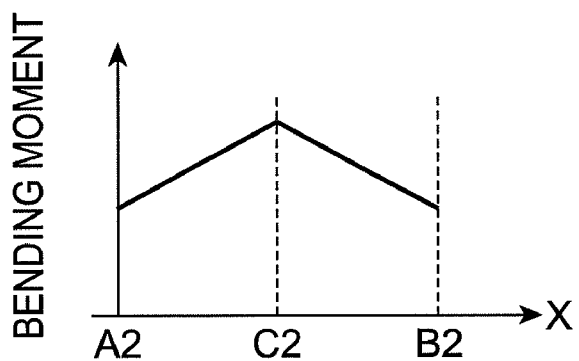

On the other hand, in a laser bar producing method shown in part (a) of FIG. 8 (which will be referred to as "method B"), the substrate product SP is supported on both sides, and the substrate product SP is supported by two support bodies spaced by a distance D between two edges 71b (X-coordinates A2, B2). The press is carried out at a position (X-coordinate C2) equal to half (D/2) of the distance D. As shown in part (b) of FIG. 8, the bending moment is applied on both sides of the press line (X-coordinate C2) CNT2, and it takes a maximum at the press line (X-coordinate C2) and decreases from the maximum toward the two edges 71b (X-coordinates A2, B2). This bending moment is directed in a direction to contribute to the fracture. Deformation of the substrate product by the press is sufficiently large at the position of the applying line and the substrate product is curved in downwardly convex shape. Therefore, the fracture is caused by the maximum of bending moment and the shear force. It is seen by comparison between FIGS. 7 and 8 that the distributions of bending moment and shear force in the substrate product SP are different from each other between the two laser bar producing methods.

The laser bar LB1 thus formed has the first and second end faces 67a, 67b formed by the aforementioned breakup and each of the end faces 67a, 67b extends from the first surface 63a to the second surface 63b. For this reason, the end faces 67a, 67b form the laser cavity of the III-nitride semiconductor laser device and intersect with the XZ plane. This XZ plane corresponds to the m-n plane defined by the m-axis of the hexagonal III-nitride semiconductor and the normal axis NX.

According to this method, the first surface 63a of the substrate product SP is scribed in the direction of the a-axis of the hexagonal III-nitride semiconductor and thereafter the breakup of the substrate product SP is carried out by the press against the second surface 63b of the substrate product SP, thereby forming the new substrate product SP1 and the laser bar LB1. For this reason, the first and second end faces 67a, 67b are formed in the laser bar LB1 so as to intersect with the m-n plane. This end face forming method provides the first and second end faces 67a, 67b with flatness and perpendicularity enough to construct the laser cavity of the III-nitride semiconductor laser device.

In this method, the laser waveguide formed extends in the direction of inclination of the c-axis of the hexagonal III-nitride. The cavity mirror end faces allowing for provision of this laser waveguide are formed without use of dry-etched facets.

This method involves the fracture of the substrate product SP, thereby forming the new substrate product SP1 and the laser bar LB1.

Step S108 is to repeatedly carry out the breakup by the press to produce many laser bars. This fracture is brought about using the scribed groove 65a shorter than a fracture line BREAK of the laser bar LB1.

Step S109 is to form dielectric multilayer films on the end faces 67a, 67b of the laser bar LB1 to form a laser bar product. Step S110 is to break this laser bar product into chips of individual semiconductor lasers.

In the fabrication method according to the present embodiment, the angle ALPHA can be in the range of not less than 45 degrees and not more than 80 degrees or in the range of not less than 100 degrees and not more than 135 degrees. When the angle is in the range of less than 45 degrees or in the range of more than 135 degrees, the end face made by press becomes highly likely to be comprised of an m-plane. When the angle is in the range of more than 80 degrees and less than 100 degrees, it could result in failing to achieve the desired flatness and perpendicularity. More preferably, the angle ALPHA can be in the range of not less than 63 degrees and not more than 80 degrees or in the range of not less than 100 degrees and not more than 117 degrees. When the angle is in the range of less than 63 degrees or in the range of more than 117 degrees, an m-plane can appear in part of an end face formed by press. When the angle is in the range of more than 80 degrees and less than 100 degrees, it could result in failing to achieve the desired flatness and perpendicularity. The semipolar primary surface 51a can be any one of a {20-21} plane, a {10-11} plane, a {20-2-1} plane, and a {10-1-1} plane. Furthermore, a surface with a slight slant in the range of not less than −4 degrees and not more than +4 degrees from these planes is also suitable for the primary surface. On these typical semipolar planes, it is feasible to provide the end faces for the laser cavity with flatness and perpendicularity enough to construct the laser cavity of the III-nitride semiconductor laser device.

The substrate 51 can be comprised of any one of GaN, AlGaN, InGaN, and InAlGaN. When the substrate used is comprised of any one of these GaN-based semiconductors, it is feasible to obtain the end faces applicable to the laser cavity. The substrate 51 is preferably comprised of GaN.

In the step S104 of forming the substrate product SP, the semiconductor substrate used in crystal growth can be one subjected to processing such as slicing or grinding so that the substrate thickness becomes not more than 400 µm, and having the second surface 63b of a processed surface formed by polishing. In this substrate thickness, the end faces 67a, 67b can be formed in good yield, with flatness and perpendicularity enough to construct the laser cavity of the III-nitride semiconductor laser device or without ion damage. More preferably, the second surface 63b is a polished surface formed by polishing and the substrate thickness after polishing is not more than 160 µm. For relatively easily handling the substrate product SP, the substrate thickness is preferably not less than 50 µm.

In the production method of the laser end faces according to the present embodiment, the angle BETA explained with reference to FIG. 3 is also defined in the laser bar LB1. In the laser bar LB1, the component $(BETA)_1$ of the angle BETA is preferably in the range of not less than (ALPHA−5) degrees and not more than (ALPHA+5) degrees on a first plane (plane corresponding to the first plane S1 in the description with reference to FIG. 3) defined by the c-axis and m-axis of the III-nitride semiconductor. The end faces 67a, 67b of the laser bar LB1 satisfy the aforementioned perpendicularity as to the angle component of the angle BETA taken from one to the other of the c-axis and the m-axis. The component $(BETA)_2$ of the angle BETA is preferably in the range of not less than −5 degrees and not more than +5 degrees on a second plane (plane corresponding to the second plane S2 shown in FIG. 3). In this case, the end faces 67a, 67b of the laser bar LB1 satisfy the aforementioned perpendicularity as to the angle component of the angle BETA defined on the plane perpendicular to the normal axis NX to the semipolar plane 51a.

The end faces 67a, 67b are formed by break by press against the plurality of GaN-based semiconductor layers epitaxially grown on the semipolar plane 51a. Since they are epitaxial films on the semipolar plane 51a, the end faces 67a, 67b are not cleaved facets with a low plane index like c-planes, m-planes, or a-planes which have been used heretofore for the conventional cavity mirrors. However, through the break of the stack of epitaxial films on the semipolar plane 51a, the end faces 67a, 67b have the flatness and perpendicularity applicable as cavity mirrors.

Example 1

A semipolar-plane GaN substrate is prepared and perpendicularity of a fractured face is observed as described below. The substrate used is a {20-21}-plane GaN substrate cut at the angle of 75 degrees toward the m-axis out of a (0001) GaN ingot thickly grown by HVPE. The primary surface of the GaN substrate is mirror-finished and the back surface is in a ground pear-skin state. The thickness of the substrate is 370 µm.

On the back side in the pear-skin state, a marking line is drawn perpendicularly to the projected direction of the c-axis on the primary surface of the substrate, with a diamond pen and thereafter a substrate product is broken by the press according to the method shown in FIG. 7.

Figure 9:
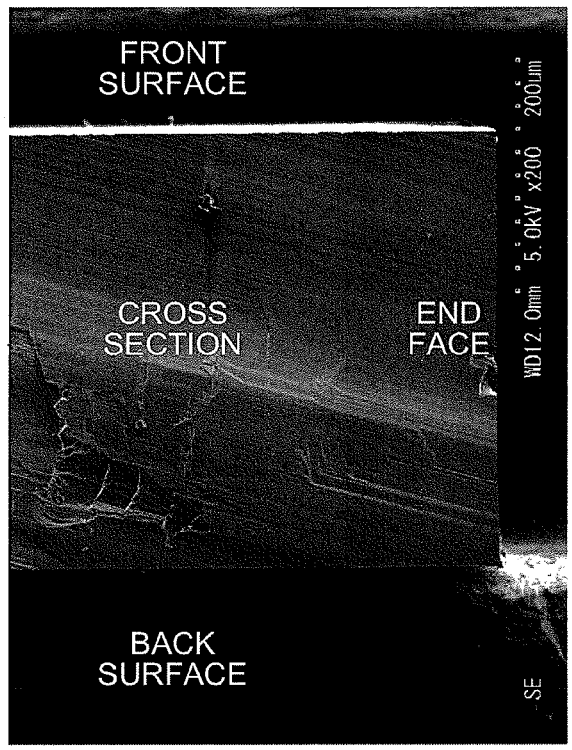
FIG. 9 is a drawing showing a scanning electron microscope image of a cavity end face, along with a {20-21} plane in crystal lattices.
Figure 9:
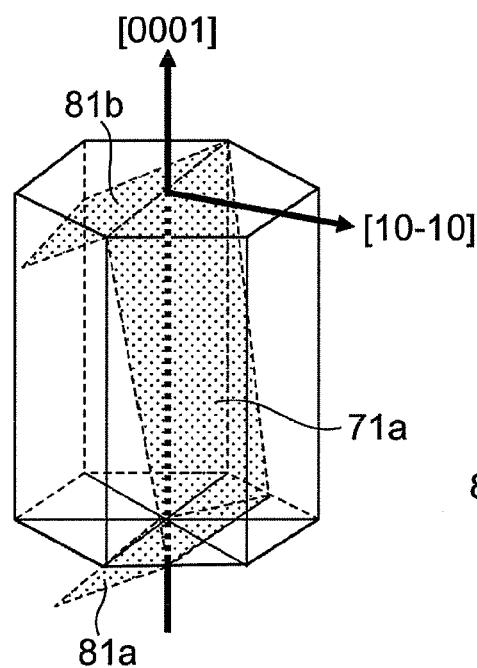
Figure 9:
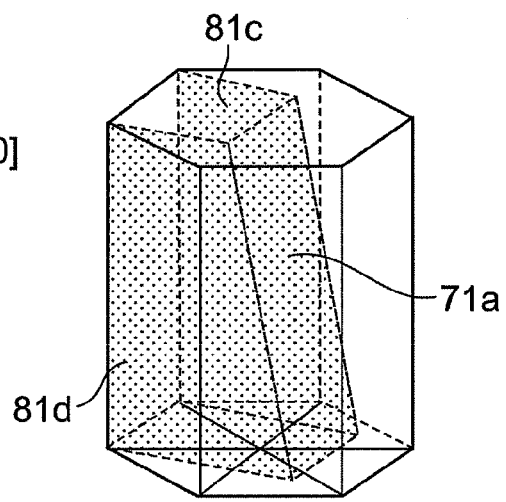

Part (a) of FIG. 9 is a scanning electron microscope image obtained by observing a fractured face from the a-plane direction, in which the right end face is the fractured face. It is seen that the fractured face has flatness and perpendicularity to the semipolar primary surface.

A region around the end face of the active layer in the fractured face formed by the break is observed with a scanning electron microscope, and no prominent unevenness is observed. From this result, the flatness (magnitude of unevenness) of the region around the end face of the active layer is believed to be not more than 20 nm. Furthermore, the perpendicularity of the fractured face to the sample surface is in the range of −5 degrees to +5 degrees.

Example 2

Figure 10:
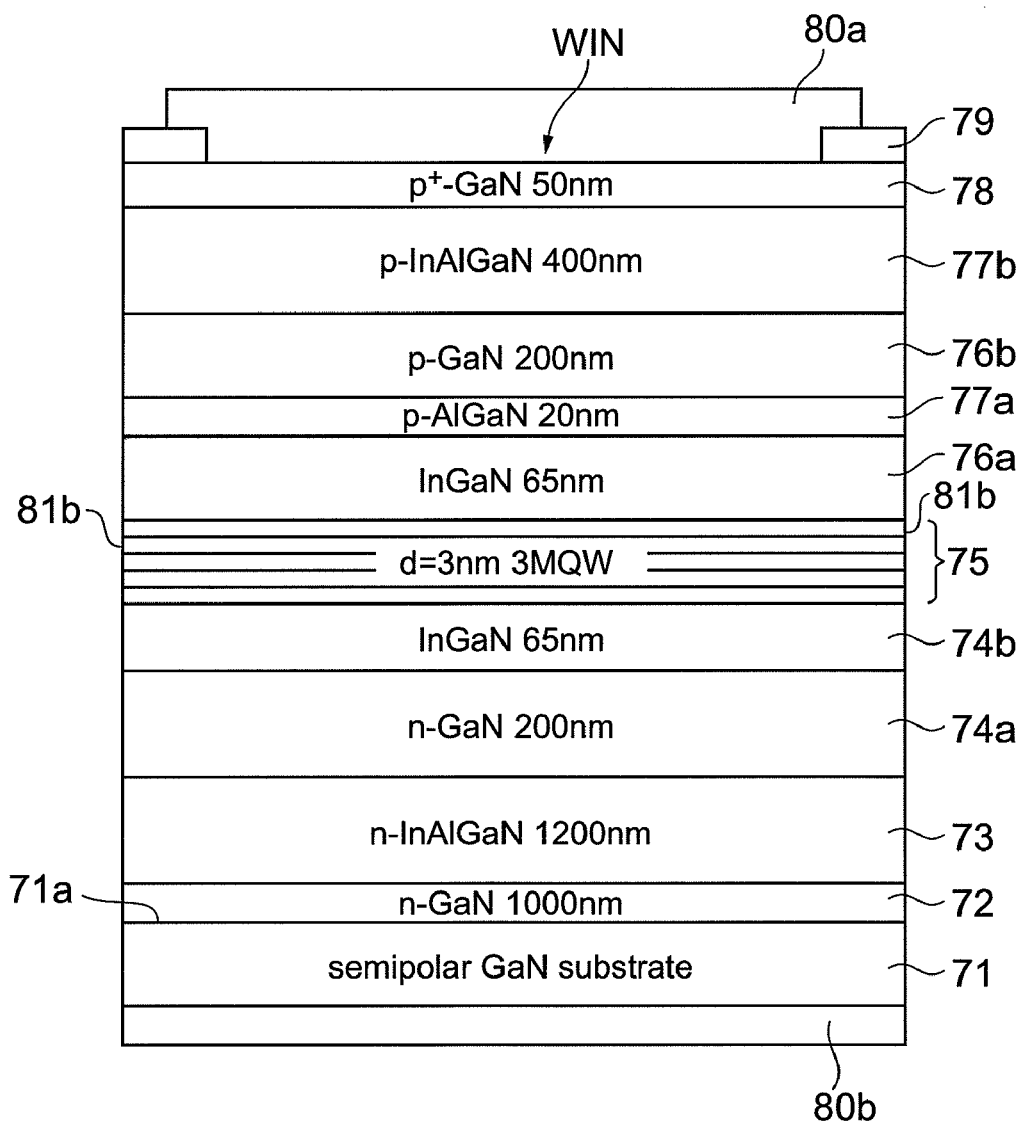
FIG. 10 is a drawing showing a structure of a laser diode shown in Example.

It is found in Example 1 that in the GaN substrate having the semipolar {20-21} plane, the fractured face obtained by drawing the marking line perpendicular to the projected direction of the c-axis on the primary surface of the substrate and pressing the substrate has the flatness and perpendicularity to the primary surface of the substrate. For checking applicability of this fractured face to the laser cavity, a laser diode shown in FIG. 10 is grown by metal-organic vapor phase epitaxy as described below. The raw materials used are trimethyl gallium (TMGa), trimethyl aluminum (TMAl), trimethyl indium (TMIn), ammonia ($NH_3$), and silane ($SiH_4$). A substrate 71 is prepared. The substrate 71 prepared is a GaN substrate cut at an angle in the range of 0 degrees to 90 degrees toward the m-axis out of a (0001) GaN ingot thickly grown by HVPE, with a wafer slicing device, in such a manner that the angle ALPHA of inclination of the c-axis toward the m-axis has a desired off angle in the range of 0 degrees to 90 degrees. For example, when the substrate is cut at the angle of 75 degrees, the resultant substrate is a {20-21}-plane GaN substrate and it is represented by reference sign 71a in the hexagonal crystal lattice shown in part (b) of FIG. 9.

This substrate 71 is placed on a susceptor in a reaction furnace and the epitaxial layers are grown according to the following growth procedure. First, n-type GaN 72 is grown in the thickness of 1000 nm. Next, an n-type InAlGaN cladding layer 73 is grown in the thickness of 1200 nm. Thereafter, an n-type GaN guide layer 74a and an undoped InGaN guide layer 74b are grown in the thickness of 200 nm and in the thickness of 65 nm, respectively, and then a three-cycle MQW 75 consisting of GaN 15 nm thick/InGaN 3 nm thick is grown. Subsequently grown are an undoped InGaN guide layer 76a in the thickness of 65 nm, a p-type AlGaN block layer 77a in the thickness of 20 nm, and a p-type GaN guide layer 76b in the thickness of 200 nm. Then a p-type InAlGaN cladding layer 77b is grown in the thickness of 400 nm. Finally, a p-type GaN contact layer 78 is grown in the thickness of 50 nm.

An insulating film 79 of $SiO_2$ is deposited on the contact layer 78 and then photolithography is used to form a stripe window WIN in the width of 10 μm by wet etching. In this step, two types of contact windows are formed along two stripe directions. They are the laser stripe along (1) M-direction (direction of the contact window extending along the predetermined plane defined by the c-axis and the m-axis), and the laser stripe along (2) A-direction: <11-20> direction.

After the formation of the stripe window, a p-side electrode 80a of Ni/Au and a pad electrode of Ti/Al are made by vapor deposition. Next, the back surface of the GaN substrate (GaN wafer) is polished using a diamond slurry to produce a substrate product with the back surface in a mirror state. At this time, the thickness of the substrate product is measured with a contact film thickness meter. The measurement of thickness may also be carried out from a sample cross section with a microscope. The microscope applicable herein is an optical microscope or a scanning electron microscope. An n-side electrode 80b of Ti/Al/Ti/Au is formed by vapor deposition on the back surface (polished surface) of the GaN substrate (GaN wafer).

The cavity mirrors for these two types of laser stripes are produced with a laser scriber using the YAG laser at the wavelength of 355 nm. When the break is implemented with the laser scriber, the oscillating chip yield can be improved as compared with the case using the diamond scribing method. The conditions for formation of the scribed grooves are as follows: laser beam output of 100 mW; scanning speed of 5 mm/s. The scribed grooves thus formed are, for example, grooves having the length of 30 μm, the width of 10 μm, and the depth of 40 μm. The scribed grooves are formed by applying the laser beam directly to the epitaxially grown surface at the pitch of 800 μm and through the aperture of the insulating film of the substrate. The cavity length is 600 μm.

After formation of the scribed marks, a laser bar is produced from the substrate product, using the breaking device. The position of the scribed groove is aligned with the center position of the breaking blade and the blade is pressed from the back surface of the substrate of the substrate product to produce the laser bar. On that occasion, the laser bar is prepared by the following two methods.

"Method A": method of pressing the blade against the back surface of the substrate of the substrate product away from the center line between the edges of the support tables, while supporting the both-side epitaxial surfaces of the substrate product by the support tables of the breaking device (e.g., bed knives).

"Method B": method of pressing the blade against the back surface of the substrate of the substrate product in alignment with the center line between the edges of the support tables, while supporting the both-side epitaxial surfaces of the substrate product by the support tables of the breaking device (e.g., bed knives).

In the both methods, the distance between the edges of the support tables (bed knives) is 1000 μm.

The cavity mirrors are made by fracture using the blade. A laser bar is produced by breaking the substrate product by the press against the back side of the substrate. More specifically, part (b) of FIG. 9 and part (c) of FIG. 9 show relations between crystal orientations and laser end faces, for the {20-21}-plane GaN substrate. Part (b) of FIG. 9 shows the case where the laser stripe is provided in the inclination direction of the m-axis direction in accordance with the present embodiment and shows end faces 81a, 81b for the laser cavity along with the semipolar plane 71a. The end faces 81a, 81b are approximately perpendicular to the semipolar plane 71a, but are different from the conventional cleaved facets such as the hitherto-used c-planes, m-planes, or a-planes. The direction of the laser stripe is different from that shown in part (c) of FIG. 9. Part (c) of FIG. 9 shows the case where the laser stripe is provided in the a-axis direction and shows end faces 81c, 81d for the laser cavity along with the semipolar plane 71a. The end faces 81c, 81d are approximately perpendicular to the semipolar plane 71a and are composed of a-planes.

Figure 11:
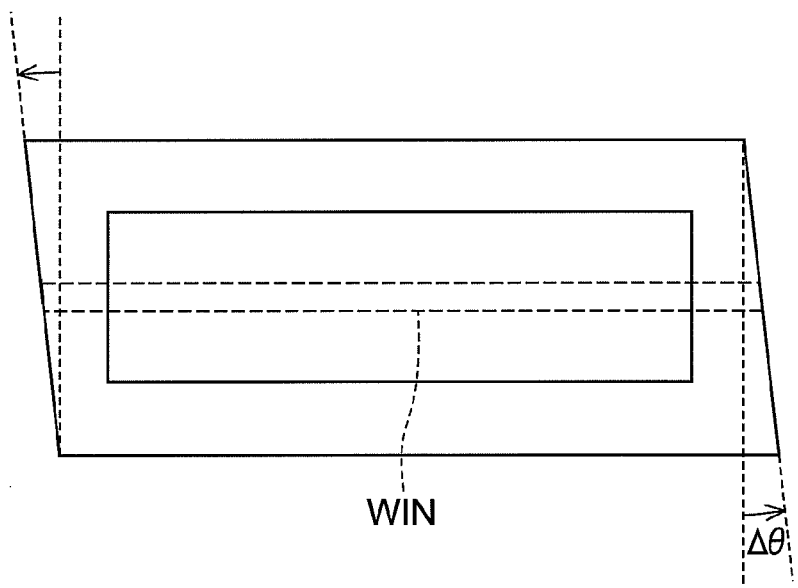
FIG. 11 is a drawing showing distributions of angles between fractured faces and laser stripes for laser cavities fabricated by method (A) and method (B).
Figure 11:
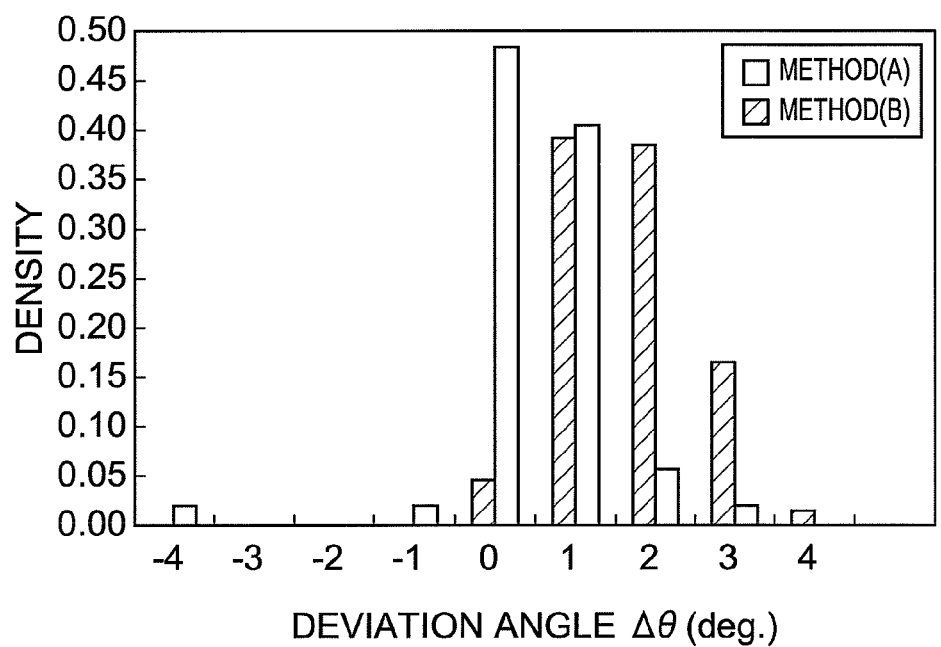

For the laser bars produced by method (A) and method (B) above, angular deviation of the cavity mirrors is measured with an optical microscope. The semiconductor epitaxial region including a plurality of semiconductor epitaxial films is grown on the substrate in the substrate product. In lasing, light traveling back and forth in the cavity propagates mainly in the semiconductor epitaxial region. For this reason, the measurement of the angular deviation of the cavity mirrors is carried out by estimating angular deviation of a cross section of the semiconductor epitaxial region appearing in the fractured face, as shown in part (a) of FIG. 11. In part (a) of FIG. 11, a window WIN shown in FIG. 10 is indicated by a dashed line, in order to show the position of the stripe waveguide. Part (b) of FIG. 11 is a histogram showing a relation of distributions of angular deviation with the laser bar producing methods. The horizontal axis represents deviation angle Δθ of cavity mirrors on the basis of the direction perpendicular to the direction of the stripe waveguide in the semiconductor epitaxial region. It is shown by the measurement results that the center of the distribution of angular deviation of the cavity mirrors in the laser bar produced by method (A) is closer to the angle of zero than that in the laser bar by method (B). The averages and standard deviations of angular deviations of the laser mirrors in the laser bars produced by methods (A) and (B) are as described below.

| Method | Average (deg.) | Standard deviation (deg.) |
|---|---|---|
| method (A): | 0.45 | 0.93 |
| method (B): | 1.57 | 0.80 |

It is seen from this result that when the laser bar is produced by method (A), the cavity mirrors with small angular deviation (with the center of deviation angle distribution being closer to zero) can be stably formed. The vertical axis represents density, which is defined by (count in each angular range)/(total count).

| Method (A) | | |
|---|---|---|
| Deviation angle (deg.) | Count | Density |
| −5 | 0 | 0.00 |
| −4 | 1 | 0.02 |
| −3 | 0 | 0.00 |
| −2 | 0 | 0.00 |
| −1 | 1 | 0.02 |
| 0 | 25 | 0.48 |
| +1 | 21 | 0.40 |
| +2 | 3 | 0.06 |
| +3 | 1 | 0.02 |
| +4 | 0 | 0.00 |

| Method (B) | | |
|---|---|---|
| Deviation angle (deg.) | Count | Density |
| −5 | 0 | 0.00 |
| −4 | 0 | 0.00 |
| −3 | 0 | 0.00 |
| −2 | 0 | 0.00 |
| −1 | 0 | 0.00 |
| 0 | 6 | 0.05 |
| +1 | 52 | 0.39 |
| +2 | 51 | 0.38 |
| +3 | 22 | 0.17 |
| +4 | 2 | 0.02 |

When the laser bar is produced by method (A), the distribution of angular deviation of the cavity mirrors shifts toward zero. It is seen from this result that when the laser bar is produced by method (A), the cavity mirrors with small angular deviation can be formed on a stable basis.

Figure 12:
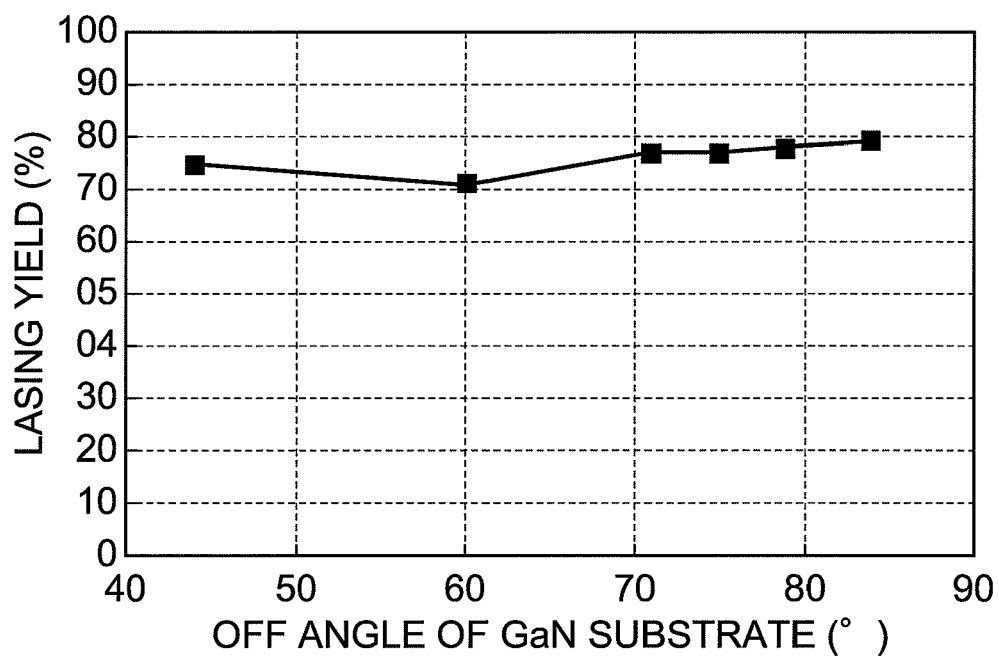
FIG. 12 is a drawing showing a relation of inclination angle of the c-axis toward the m-axis of GaN substrate versus oscillation yield.

FIG. 12 is a drawing showing a relation of the inclination angle ALPHA (off-axis angle) of the c-axis toward the m-axis of the GaN substrate versus cavity yield. In the present example, the cavity yield is defined as (the number of cavities with the deviation angle in the epitaxial surface of not more than 1 degree)/(the total number of cavities subjected to the measurement of deviation angle). It is seen from FIG. 12 that there is no significant variation in cavity yield when the semipolar plane to be used is one having the off-axis angle in the range of 45 degrees to 80 degrees.

| Off angle (deg.) | Yield (%) |
|---|---|
| 44 | 74.7 |
| 60 | 71.3 |
| 71 | 77.1 |
| 75 | 77.3 |

-continued

| Off angle (deg.) | Yield (%) |
|---|---|
| 79 | 78.0 |
| 84 | 79.2 |

Figure 13:
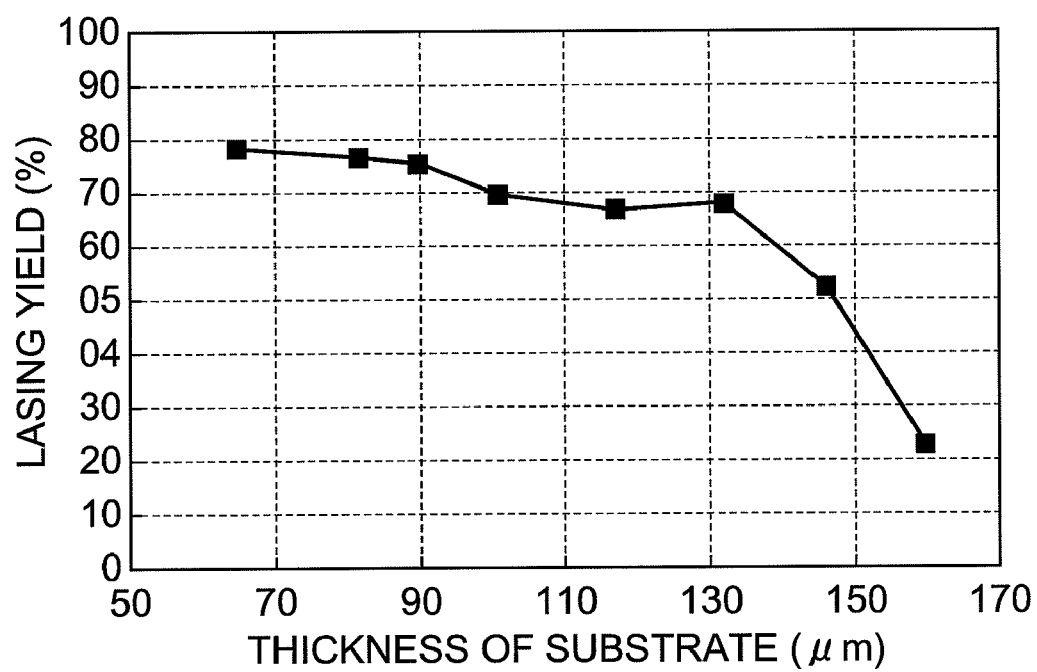
FIG. 13 is a drawing showing a relation of substrate thickness versus oscillation yield.

FIG. 13 is a drawing showing a relation of substrate thickness versus cavity yield. With reference to FIG. 13, when the thickness of the substrate product is smaller than 50 μm, the laser bar can be more likely to be broken because handling becomes not easy. According to Inventors' knowledge, when the thickness of the substrate produce is not less than 50 μm, handling is possible without significant difficulty, and it is possible to produce the cavity by fracture. The laser bar can be produced when the thickness of the substrate product is up to 160 μm. As the thickness increases over 150 μm, the cavity yield starts decreasing. From this experiment and other results, the thickness of the substrate product is preferably in the range of not less than 50 μm and not more than 150 μm.

| Thickness (μm) | Yield (%) |
|---|---|
| 65 | 78.3 |
| 82 | 76.9 |
| 90 | 75.5 |
| 101 | 69.9 |
| 117 | 66.7 |
| 132 | 68.1 |
| 146 | 52.3 |
| 160 | 22.7 |

The end faces of the laser bar are coated with a dielectric multilayer film by vacuum vapor deposition. The dielectric multilayer film is composed of an alternate stack of $SiO_2$ and $TiO_2$. The thickness of each layer is adjusted in the range of 50 to 100 nm and is designed so that the center wavelength of reflectance fell within the range of 500 to 530 nm. The reflecting surface on one side has ten cycles and the designed value of reflectance of about 95%, and the reflecting surface on the other side has six cycles and the designed value of reflectance of about 80%.

Evaluation by energization is carried out at room temperature. A power supply used is a pulsed power source with the pulse width of 500 ns and the duty ratio of 0.1% and the energization is implemented with needles on the surface electrodes. On the occasion of light output measurement, the emission from the laser bar end face is detected with a photodiode to check the current-optical output characteristic (I-L characteristic). In measurement of emission wavelength, the emission from the laser bar end face is made to pass through an optical fiber and a spectrum thereof is measured with a spectrum analyzer as a detector. In checking a polarization state, the emission from the laser bar is made to pass through a polarizing plate to rotate, thereby checking the polarization state. In observation of LED-mode emission, an optical fiber is arranged on the front surface side of the laser bar to measure light emitted from the front surface.

The polarization state after oscillation is checked for every laser, and it is found that the light is polarized in the a-axis direction. The oscillation wavelength of the light emitting region of the active layer is 500-530 nm.

Figure 14:
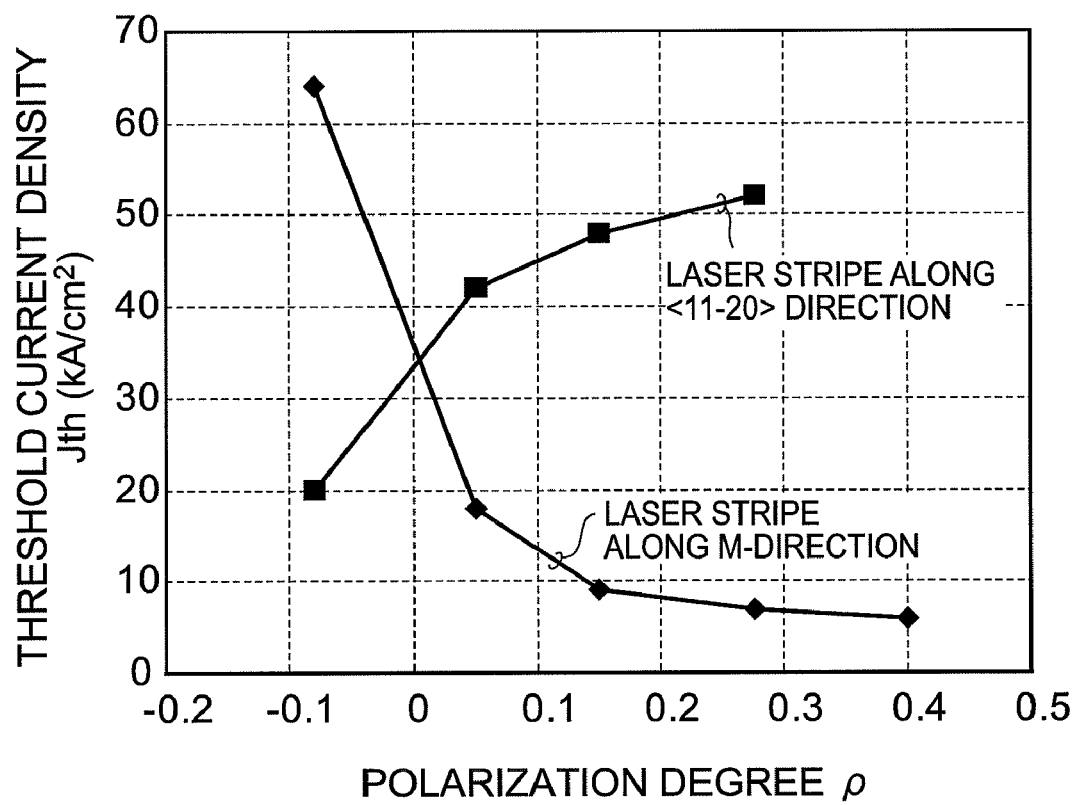
FIG. 14 is a drawing showing a relation of determined polarization degree ρ versus threshold current density.

The polarization state in the LED mode (spontaneous emission) is measured for every laser. When the polarization component in the a-axis direction is $I1$ and the polarization component in the projected direction of the m-axis on the primary surface is $I2$, the polarization degree ρ is defined as (I1−I2)/(I1+I2). In this way, the relation between determined polarization degree ρ and minimum of threshold current density is investigated and the result obtained is as shown in FIG. 14. It is seen from FIG. 14 that the threshold current density demonstrates a significant decrease in the case of the laser (1) with the laser stripe along the M-direction when the polarization degree is positive. Namely, it is seen that when the polarization degree is positive (I1>I2) and when the waveguide is provided along an off direction, the threshold current density is significantly decreased.

Figure 15:
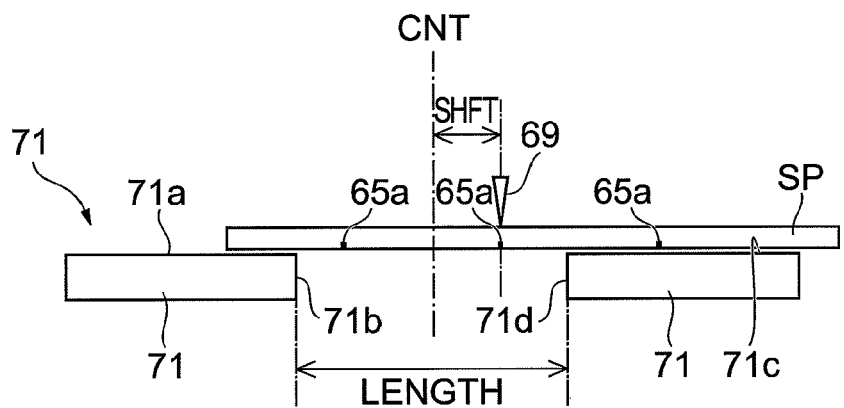
FIG. 15 is a drawing showing a relation of cavity yield versus distance between a press line for press with a blade and a center line CNT of a spacing between support portions (bed knives).
Figure 15:
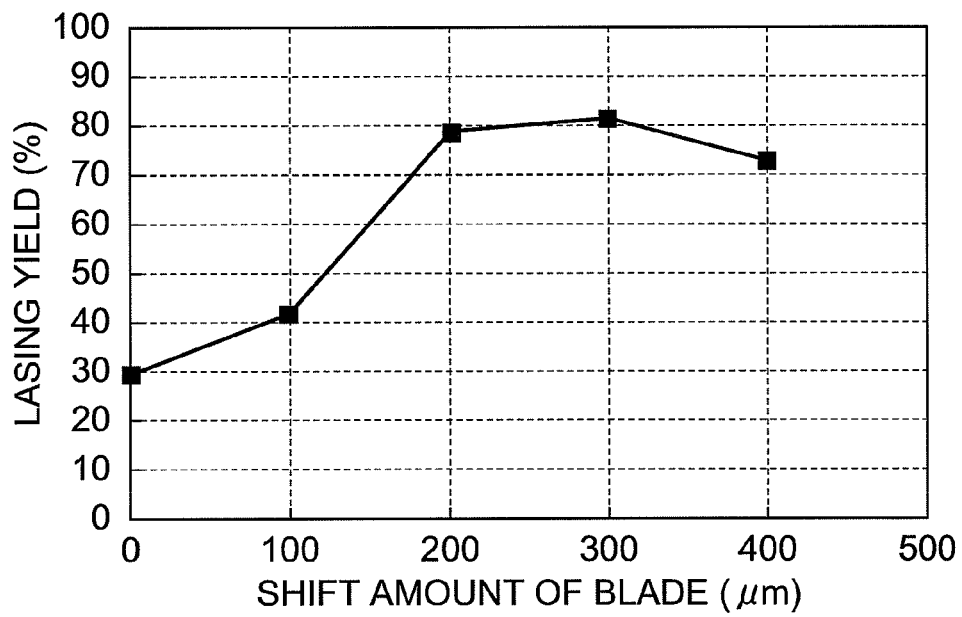

FIG. 15 is a drawing showing a relation of cavity yield versus distance between the press line for press with the blade and the center line CNT of the spacing between the support portions (bed knives). In part (a) of FIG. 15, the spacing between the support portions of the support device is referred to as "LENGTH" and the distance between the press line for press with the blade and the center line CNT of the spacing between the support portions is represented by "SHFT" as a relative shift amount of the blade to the center line. In this experiment, the spacing between the support portions is fixed at 1000 μm. As shown in part (b) of FIG. 15, the shift amount SHFT of the blade defined as the distance between the center line CNT and the press line is varied in the range of 0 μm to 400 μm. Fractured faces are successfully produced by application of shear force with the shift in this range. When the distance between the center line and the press line is smaller than 200 μm, the cavity yield tends to decrease. A conceivable reason for it is that the laser bar producing method becomes closer to method (A) as the shift amount decreases toward zero. When the shift amount is zero, the yield is 29.3%. With the shift amount of 100 μm, improvement in yield is achieved. In this experiment, the cavity yield is high in the range of 200 μm to 400 μm. It is seen therefrom that the cavity yield is maintained at the high level. In order to prevent interference between the blade and the bed knife during the press on the substrate product with the blade, the distance between the center line and the press line is set in the range of not more than 400 μm. From the above result, the distance between the center line and the press line is preferably in the range of not less than 200 μm and not more than 400 μm.

| Shift amount (μm) | Cavity yield (%) |
|---|---|
| 0 | 29.3 |
| 100 | 41.5 |
| 200 | 78.4 |
| 300 | 81.2 |
| 400 | 72.6 |

Figure 16:
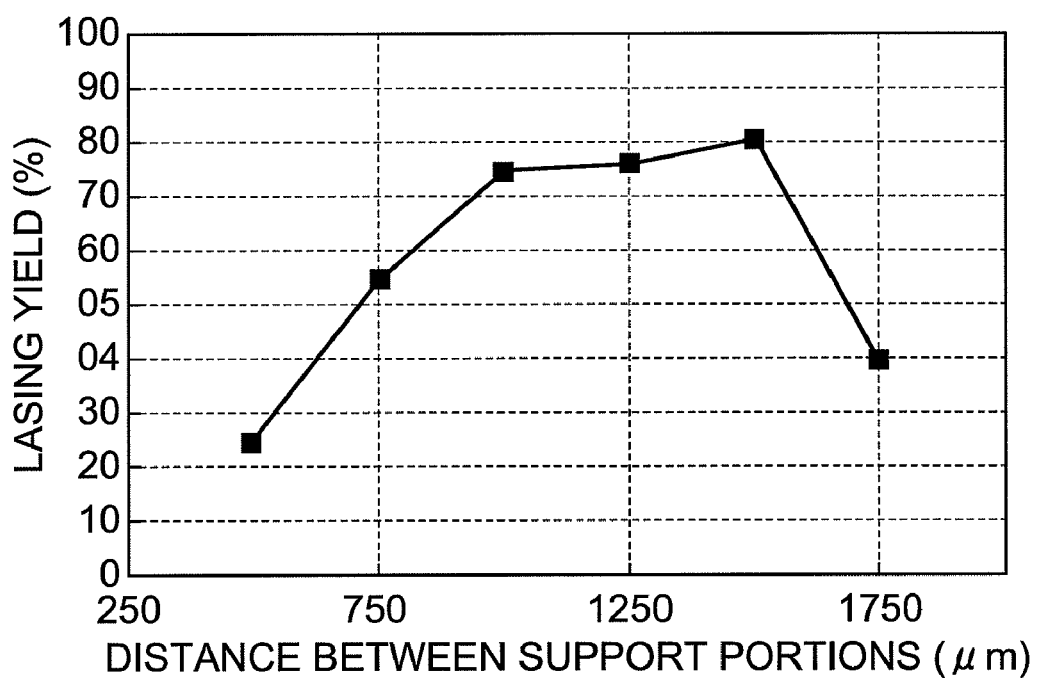
FIG. 16 is a drawing showing a relation of cavity yield versus spacing between support portions (bed knives).

FIG. 16 is a drawing showing a relation of cavity yield versus spacing between the support portions. In this case, the shift amount SHFT is fixed at 200 μm and the thickness of the substrate is 80 μm. A laser bar is produced with the cavity length of 600 μm. It is considered that as the spacing between the support portions (LENGTH) becomes smaller than 1000 μm, the bending moment acting on the substrate product decreases, so as to lower the yield in production of the laser bar. In a setup where the spacing between the support portions (LENGTH) is larger than 1500 μm, there are three or more scribed grooves in the spacing between the support portions (LENGTH) in the case of the cavity length of 600 μm in the present example, and fracture may fail to propagate along a scribed line at a desired position, which will make production of the laser bar unstable. This is considered to be the cause to lower the yield in production of the laser bar. In the present example, the spacing between the bed knives is preferably not less than 1000 μm and not more than 1500 μm.

| Spacing LENGTH (μm) | Cavity yield (%) |
|---|---|
| 500 | 24.3 |
| 750 | 54.6 |
| 1000 | 74.4 |
| 1250 | 76.0 |
| 1500 | 80.2 |
| 1750 | 39.7 |

From the above and other experiment results, a ratio (SHFT/LCV) of the distance between the center line CNT and the press line as the reference line on the first surface 63a (which is "SHFT" shown in FIG. 7) to the cavity length LCV is preferably not less than ⅓ (200 μm/600 μm). The ratio (SHFT/LCV) is preferably in the range of not more than ⅔ (400 μm/600 μm). From the above description, the ratio (SHFT/LCV) is preferably in the range of not less than ⅓ and not more than ⅔. Furthermore, a ratio (LENGTH/LCV) of the distance between the edges in the support device 71 (which is the spacing LENGTH between the first edge 71b and the second edge 71d) to the cavity length LCV is preferably not less than 5/3 (1000 μm/600 μm). The ratio (LENGTH/LCV) is preferably not more than 5/2 (1500 μm/600 μm). From the above description, the ratio (LENGTH/LCV) is preferably in the range of not less than 5/3 and not more than 5/2.

Example 3

In Example 2, the plural epitaxial films for the semiconductor laser are grown on the GaN substrate having the {20-21} plane. The end faces for the optical cavity are formed by the formation of scribed grooves and the press as described above. In order to find candidates for these end faces, plane orientations making an angle near 90 degrees to the (20-21) plane and being different from the a-plane are determined by calculation. The following angles and plane orientations have angles near 90 degrees to the (20-21) plane.

| Specific plane index | Angle to {20-21} plane |
|---|---|
| (−1016): | 92.46 degrees; |
| (−1017): | 90.10 degrees; |
| (−1018): | 88.29 degrees. |

Figure 17:
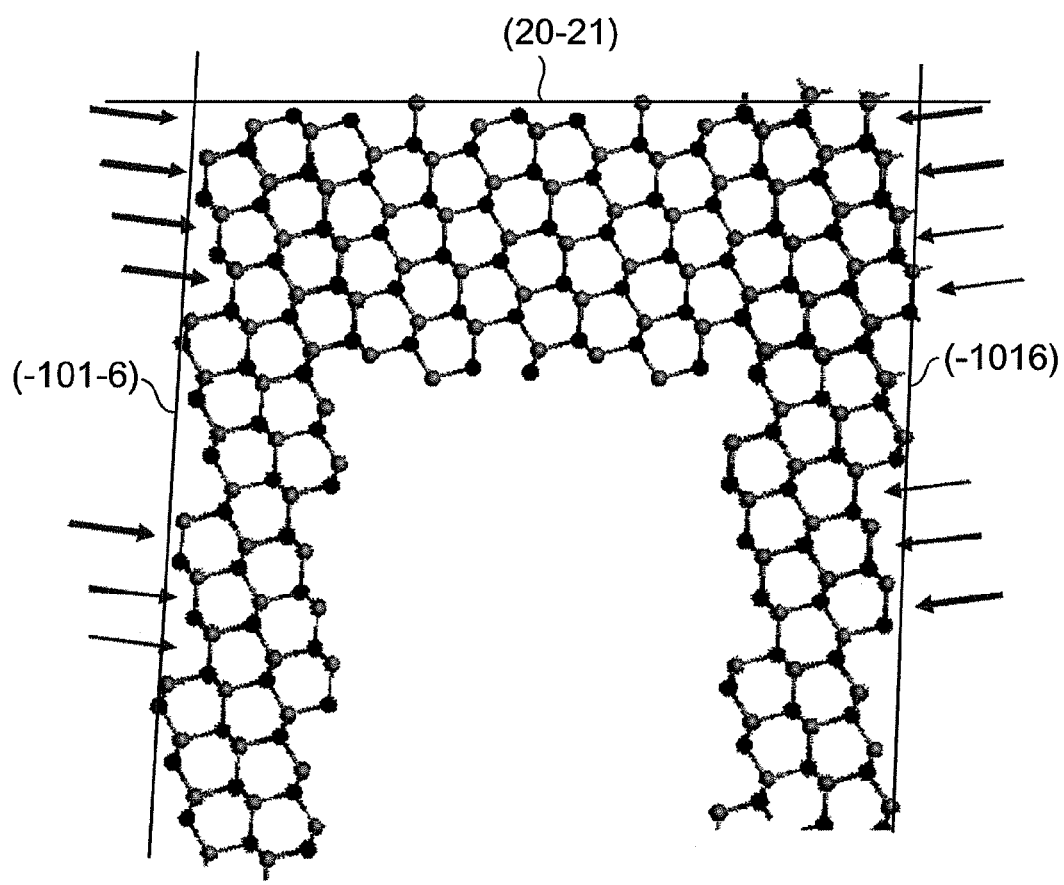
FIG. 17 is a drawing showing atomic arrangements in (20-21) plane, (−101-6) plane, and (−1016) plane.
Figure 18:
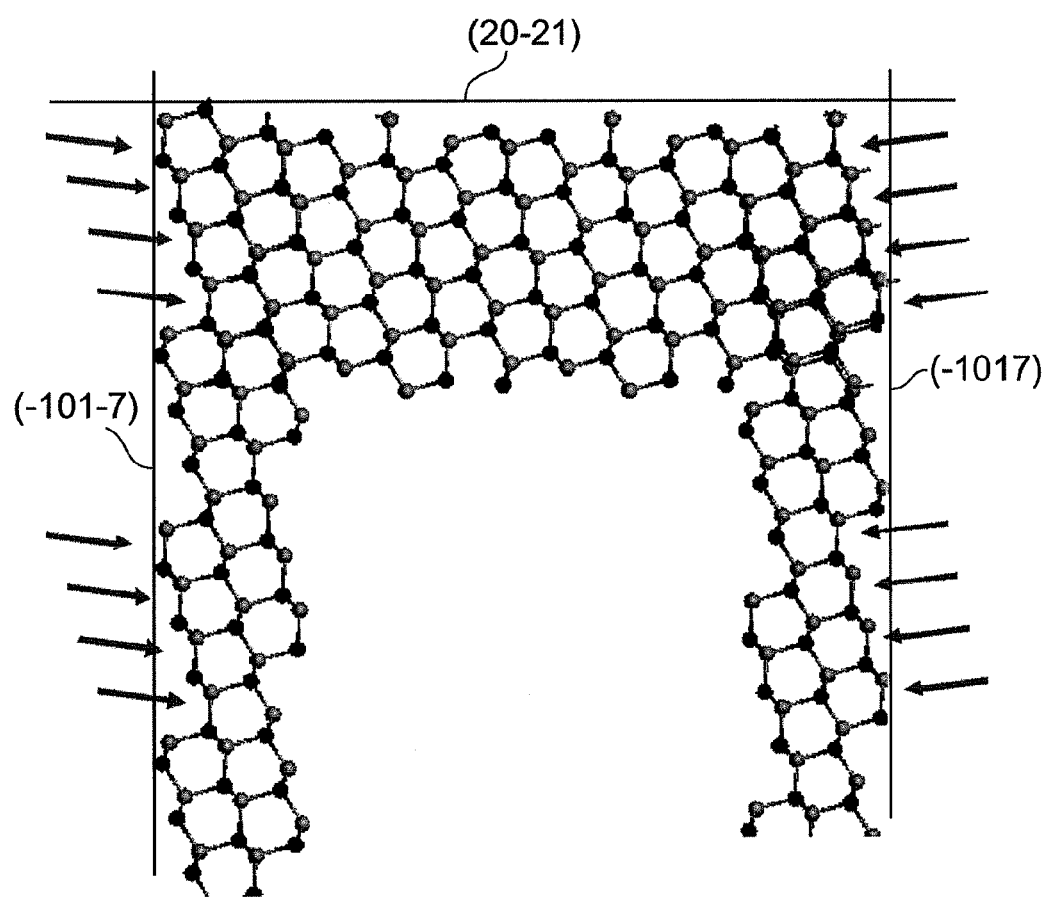
FIG. 18 is a drawing showing atomic arrangements in (20-21) plane, (−101-7) plane, and (−1017) plane.
Figure 19:
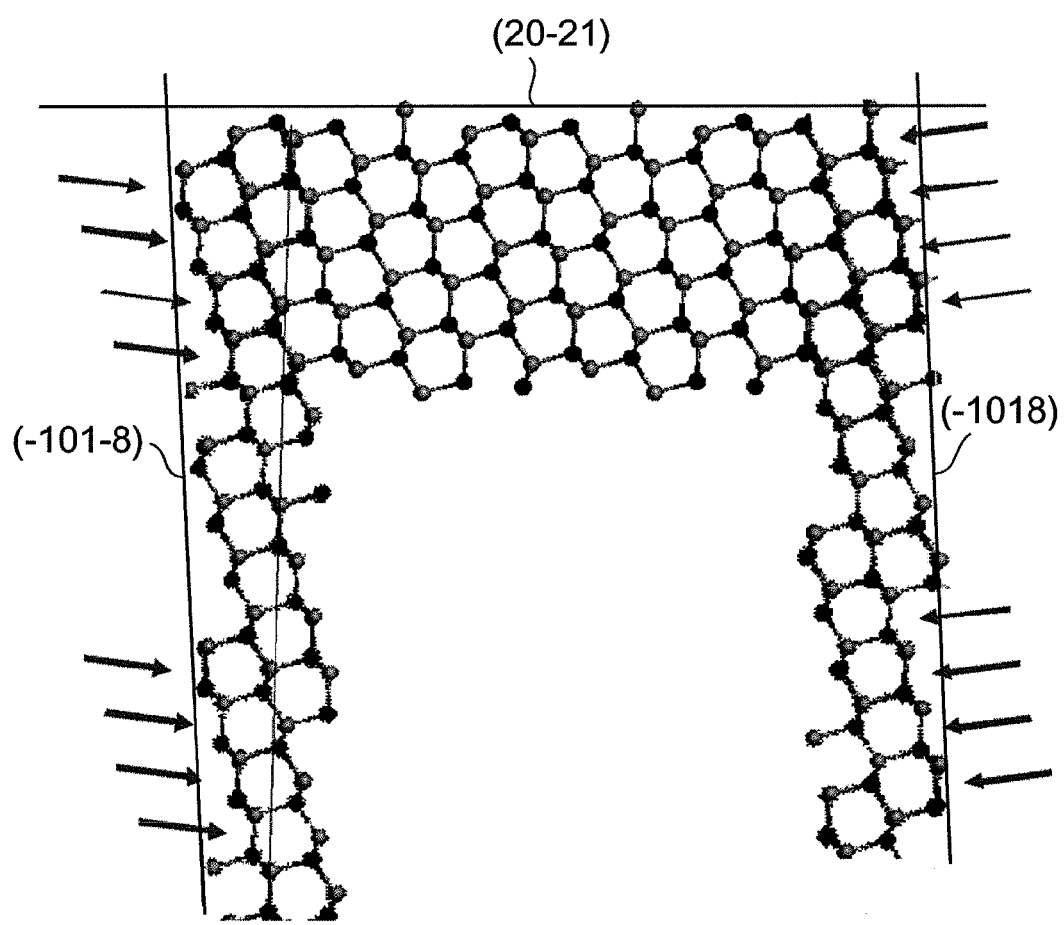
FIG. 19 is a drawing showing atomic arrangements in (20-21) plane, (−101-8) plane, and (−1018) plane.

FIG. 17 is a drawing showing atomic arrangements in the (20-21) plane, (−101-6) plane, and (−1016) plane. FIG. 18 is a drawing showing atomic arrangements in the (20-21) plane, (−101-7) plane, and (−1017) plane. FIG. 19 is a drawing showing atomic arrangements in the (20-21) plane, (−101-8) plane, and (−1018) plane. As shown in FIGS. 17 to 19, local atom arrangements indicated by arrows show configurations of neutral atoms in terms of charge and electrically neutral atom arrangements appear periodically. The reason why the relatively normal faces are obtained to the grown surface can be that generation of fractured faces is considered to be relatively stable because of the periodic appearance of the neutral atomic configurations in terms of charge.

According to various experiments including the above-described Examples 1 to 3, the angle ALPHA can be in the range of not less than 45 degrees and not more than 80 degrees or in the range of not less than 100 degrees and not more than 135 degrees. In order to improve the oscillating chip yield, the angle ALPHA can be in the range of not less than 63 degrees and not more than 80 degrees or in the range of not less than 100 degrees and not more than 117 degrees. The typical semipolar primary surface can be any one of the {20-21} plane, {10-11} plane, {20-2-1} plane, and {10-1-1} plane. Furthermore, the primary surface can be a slight slant surface from these semipolar planes. The semipolar primary surface can be, for example, a slight slant surface off in the range of not less than −4 degrees and not more than +4 degrees toward the m-plane from any one of the {20-21} plane, {10-11} plane, {20-2-1} plane, and {10-1-1} plane.

The embodiment provides the III-nitride semiconductor laser device with the laser cavity enabling the reduction of threshold current, on the semipolar plane of the support base inclined from the c-axis toward the m-axis of the hexagonal III-nitride. The embodiment also provides the method for fabricating the III-nitride semiconductor laser, which can improve the flatness of the cavity mirrors in the III-nitride semiconductor laser device and which can reduce the threshold current.

The principle of the present invention has been illustrated and described in the preferred embodiments, but it should be noted that it is recognized by those skilled in the art that the present invention can be modified in arrangement and detail without departing from the principle. The present invention is by no means limited to the specific configurations disclosed in the embodiments. Therefore, the inventor claims all modifications and changes falling within the scope of claims and coming from the scope of spirit of the invention.

What is claimed is:

1. A method for fabricating a III-nitride semiconductor laser device, comprising the steps of:
    forming a substrate product having a laser structure, the laser structure including a substrate and a semiconductor region, the substrate comprising a hexagonal III-nitride semiconductor and having a semipolar primary surface, and the semiconductor region being formed on the semipolar primary surface;
    scribing a first surface of the substrate product to form a scribed mark on the first surface, the scribed mark extending along a reference line indicative of a direction of an a-axis of the hexagonal III-nitride semiconductor;
    mounting the substrate product on a breaking device such that first and second support portions of the breaking device support first and second regions of the substrate product, respectively, after forming the scribed mark; and
    carrying out breakup of the substrate product by press in alignment with the scribed mark in a third region of the substrate product, without supporting the third region, to form another substrate product and a laser bar, the third region being located between the first and second regions,
    the third region of the substrate product being adjacent to the first and second regions,
    the press being implemented against a second surface of the substrate product,
    a first edge of the first support portion being separated from a second edge of the second support portion,
    the substrate product being mounted on the breaking device so that the reference line is apart from a center line defining a center between the first edge and the second edge,
    the first surface being a surface opposite to the second surface,
    the semiconductor region being located between the first surface and the substrate,
    the laser bar has first and second end faces extending from the first surface to the second surface and being made by the breakup,
    the first and second end faces forming a laser cavity of the III-nitride semiconductor laser device,
    the substrate product comprising an anode electrode and a cathode electrode provided on the laser structure,
    the semiconductor region including a first cladding layer, a second cladding layer, and an active layer provided between the first cladding layer and the second cladding layer, the first cladding layer comprising a first conductivity type GaN-based semiconductor, and the second cladding layer comprising a second conductivity type GaN-based semiconductor,
    the first cladding layer, the second cladding layer, and the active layer being arranged along a normal axis normal to the semipolar primary surface,
    a c-axis of the hexagonal III-nitride semiconductor of the substrate being inclined at an angle ALPHA with respect to an axis normal to the semipolar primary surface toward an m-axis of the hexagonal III-nitride semiconductor, and
    the first and second end faces intersecting with an m-n plane defined by the m-axis of the hexagonal III-nitride semiconductor and the normal axis normal to the semipolar primary surface.

2. The method according to claim 1, wherein the angle ALPHA is in one of a range of not less than 45 degrees and not more than 80 degrees and a range of not less than 100 degrees and not more than 135 degrees.

3. The method according to claim 1, wherein when the substrate product is mounted on the breaking device, a distance between the reference line and the center line is not less than 100 μm.

4. The method according to claim 1, wherein a distance between the reference line and the center line is in a range of not less than 200 μm and not more than 400 μm on the first surface.

5. The method according to claim 1, wherein a distance between the first edge and the second edge is in a range of not less than 1000 μm and not more than 1500 μm.

6. The method according to claim 1, wherein the scribed mark extends in a direction from the first surface to the second surface, along an a-n plane defined by the direction of the a-axis and the normal axis normal to the semipolar primary surface.

7. The method according to claim 1,
    wherein the step of forming the substrate product comprises subjecting the substrate to such processing that a thickness of the substrate becomes not less than 50 μm,
    wherein the processing is one of slicing and grinding, and
    wherein the second surface is one of a processed surface made by the processing and a surface including an electrode formed on the processed surface.

8. The method according to claim 1,
    wherein the scribing is carried out using a laser scriber,
    wherein the scribed mark comprises a scribed groove, and
    wherein the scribed groove extends in a direction from the first surface to the second surface, along an a-n plane defined by the direction of the a-axis and the normal axis to the semipolar primary surface.

9. The method according to claim 1,
    wherein the semipolar primary surface is a surface with a slant toward an m-plane in a range of not less than −4 degrees and not more than +4 degrees from any one of following semipolar planes: a {20-21} plane, a {10-11} plane, a {20-2-1} plane, and a {10-1-1} plane.

10. The method according to claim 1, wherein the semipolar primary surface is any one of a {20-21} plane, a {10-11} plane, a {20-2-1} plane, and a {10-1-1} plane.

11. The method according to claim 10, wherein the substrate comprises any one of GaN, AlGaN, AlN, InGaN, and InAlGaN.

12. The method according to claim 1,
wherein an end face of the active layer in each of the first and second end faces makes an angle, defined on a first plane defined by the c-axis and the m-axis of the hexagonal III-nitride semiconductor, in a range of not less than (ALPHA−5) degrees and not more than (ALPHA+5) degrees with respect to a reference plane perpendicular to the m-axis of the substrate.

13. The method according to claim 12, wherein the angle is in a range of not less than −5 degrees and not more than +5 degrees on a second plane perpendicular to the first plane and the normal axis normal to the semipolar primary surface.

14. The method according to claim 1, wherein a ratio of a length of the laser cavity to a distance between the reference line and the center line is in a range of not less than ⅓ and not more than ⅔, on the first surface.

15. The method according to claim 1, wherein a ratio of a distance between the first edge and the second edge to a length of the laser cavity is in the range of not less than 5/3 and not more than 5/2.

16. The method according to claim 1, wherein the substrate comprises any one of GaN, AlGaN, AlN, InGaN, and InAlGaN.

17. The method according to claim 1, wherein a thickness of the substrate is not less than 50 μm.

18. The method according to claim 1, wherein the angle ALPHA is in a range of not less than 63 degrees and not more than 80 degrees and not less than 100 degrees and not more than 117 degrees.

19. The method according to claim 1, wherein the active layer includes a light emitting region provided so as to generate light at a wavelength of not less than 360 nm and not more than 600 nm.

* * * * *